United States Patent
Yang et al.

(10) Patent No.: US 11,651,743 B2
(45) Date of Patent: May 16, 2023

(54) LIGHT EMITTING SUBSTRATE, METHOD OF DRIVING LIGHT EMITTING SUBSTRATE, AND DISPLAY DEVICE

(71) Applicant: BOE Technology Group Co., Ltd., Beijing (CN)

(72) Inventors: Ming Yang, Beijing (CN); Wei Hao, Beijing (CN); Feifei Wang, Beijing (CN); Minghua Xuan, Beijing (CN); Zhenyu Zhang, Beijing (CN); Xiaochuan Chen, Beijing (CN); Lingyun Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 17 days.

(21) Appl. No.: 17/426,939

(22) PCT Filed: Mar. 17, 2020

(86) PCT No.: PCT/CN2020/079734
§ 371 (c)(1),
(2) Date: Jul. 29, 2021

(87) PCT Pub. No.: WO2021/184202
PCT Pub. Date: Sep. 23, 2021

(65) Prior Publication Data
US 2022/0319452 A1    Oct. 6, 2022

(51) Int. Cl.
*H01L 25/16* (2006.01)
*G09G 3/34* (2006.01)

(52) U.S. Cl.
CPC ... *G09G 3/3426* (2013.01); *G09G 2310/0243* (2013.01); *G09G 2310/08* (2013.01);
(Continued)

(58) Field of Classification Search
CPC .............. H01L 25/167; G09G 2330/12; G09G 2310/08; G09G 2300/0426; G09G 2330/021
See application file for complete search history.

(56) References Cited

U.S. PATENT DOCUMENTS

2002/0196214 A1* 12/2002 Park ..................... G09G 3/3225
345/82
2003/0095086 A1   5/2003 Neuhaeusler et al.
(Continued)

FOREIGN PATENT DOCUMENTS

| CN | 101039539 A | 9/2007 |
| CN | 104347034 A | 2/2015 |

(Continued)

OTHER PUBLICATIONS

Jan. 5, 2023—(EP) Extended European Search Report Appn 20925742.7.

*Primary Examiner* — Shaheda A Abdin
(74) *Attorney, Agent, or Firm* — Banner & Witcoff, Ltd.

(57) ABSTRACT

A light emitting substrate, a method of driving a light emitting substrate, and a display device are provided. The light emitting substrate includes a plurality of light emitting units arranged in an array. Each light emitting unit includes a driving circuit, a plurality of light emitting elements, and a driving voltage terminal. The plurality of light emitting elements are sequentially connected in series and connected between the driving voltage terminal and the output terminal of the driving circuit. The driving circuit is configured to output a relay signal through the output terminal in a first period according to a first input signal received by the first input terminal and a second input signal received by the second input terminal, and supply a driving signal to the
(Continued)

plurality of light emitting elements sequentially connected in series through the output terminal in a second period.

18 Claims, 11 Drawing Sheets

(52) U.S. Cl.
CPC . *G09G 2320/064* (2013.01); *G09G 2330/021* (2013.01); *G09G 2330/12* (2013.01); *G09G 2370/00* (2013.01); *H01L 25/167* (2013.01)

(56) References Cited

U.S. PATENT DOCUMENTS

| | | | | |
|---|---|---|---|---|
| 2003/0122493 A1* | 7/2003 | Miyata | ............ | G09G 3/32 |
| | | | | 315/169.1 |
| 2005/0219163 A1* | 10/2005 | Smith | ............ | G09G 3/3216 |
| | | | | 345/76 |
| 2006/0097965 A1* | 5/2006 | Deane | ............ | G09G 3/3233 |
| | | | | 345/76 |
| 2011/0069094 A1* | 3/2011 | Knapp | ............ | G09G 3/3426 |
| | | | | 345/82 |

FOREIGN PATENT DOCUMENTS

| | | |
|---|---|---|
| CN | 105741749 A | 7/2016 |
| CN | 109801568 A | 5/2019 |
| EP | 2713357 A1 | 4/2014 |
| KR | 1020100131848 A | 12/2010 |

* cited by examiner

LIGHT EMITTING SUBSTRATE, METHOD OF DRIVING LIGHT EMITTING SUBSTRATE, AND DISPLAY DEVICE

The application is a U.S. National Phase Entry of International Application No. PCT/CN2020/079734 filed on Mar. 17, 2020, designating the United States of America. The present application claims priority to and the benefit of the above-identified applications and the above-identified applications are incorporated by reference herein in their entirety.

TECHNICAL FIELD

Embodiments of the present disclosure relate to a light emitting substrate, a method of driving a light emitting substrate, and a display device.

BACKGROUND

With development of the light emitting diode technology, backlights using light emitting diodes of an order of sub-millimeter or even micron are widely used, which thus can not only make an image contrast of a transmissive display product using the backlight reach a level of an organic light emitting diode (OLED) display product, but also can make the product retain technical advantages of the liquid crystal display (LCD), so as to further improve the display effect of the image and provide users with a better visual experience.

SUMMARY

At least one embodiment of the present disclosure provides a light emitting substrate, which comprises a plurality of light emitting units arranged in an array. Each light emitting unit comprises a driving circuit, a plurality of light emitting elements, and a driving voltage terminal. The driving circuit comprises a first input terminal, a second input terminal, and an output terminal, and the plurality of light emitting elements are sequentially connected in series and connected between the driving voltage terminal and the output terminal. The driving circuit is configured to output a relay signal through the output terminal in a first period according to a first input signal received by the first input terminal and a second input signal received by the second input terminal, and supply a driving signal to the plurality of light emitting elements sequentially connected in series through the output terminal in a second period.

For example, in the light emitting substrate provided by an embodiment of the present disclosure, the driving circuit further comprises a demodulating circuit, a physical layer interface circuit, a data processing control circuit, a pulse width modulating circuit, a driving signal generating circuit, and a relay signal generating circuit. The demodulating circuit is electrically connected with the second input terminal and the physical layer interface circuit, and is configured to demodulate the second input signal to obtain communication data, and transmit the communication data to the physical layer interface circuit. The physical layer interface circuit is also electrically connected with the data processing control circuit, and is configured to process the communication data to obtain a data frame, and transmit the data frame to the data processing control circuit. The data processing control circuit is also electrically connected with the first input terminal, the pulse width modulating circuit, and the relay signal generating circuit, and is configured to generate a pulse width control signal based on the data frame and transmit the pulse width control signal to the pulse width modulating circuit, and generate a relay control signal based on the first input signal and transmit the relay control signal to the relay signal generating circuit. The pulse width modulating circuit is also electrically connected with the driving signal generating circuit, and is configured to generate a pulse width modulating signal in response to the pulse width control signal, and transmit the pulse width modulating signal to the driving signal generating circuit. The driving signal generating circuit is also electrically connected with the output terminal, and is configured to generate the driving signal in response to the pulse width modulating signal, and output the driving signal through the output terminal. The relay signal generating circuit is also electrically connected with the output terminal, and is configured to generate the relay signal based on the relay control signal, and output the relay signal through the output terminal.

For example, in the light emitting substrate provided by an embodiment of the present disclosure, the second input signal is a power line carrier communication signal, and the power line carrier communication signal contains information corresponding to the communication data.

For example, the light emitting substrate provided by an embodiment of the present disclosure further comprises a plurality of address transfer lines. The plurality of address transfer lines extend in a first direction and are configured to transmit the first input signal, the plurality of light emitting units are arranged in N rows and M columns and are divided into a plurality of groups, each group of light emitting units comprise X rows and M columns, a total of X*M light emitting units, and the plurality of address transfer lines are in on-to-one correspondence with the plurality of groups of light emitting units. In a same group of light emitting units, the X*M light emitting units are sequentially numbered according to row and column distribution positions, a first input terminal of a driving circuit of a light emitting unit numbered 1 is electrically connected with an address transfer line corresponding to the group of light emitting units, an output terminal of a driving circuit of a light emitting unit numbered P is electrically connected with a first input terminal of a driving circuit of a light emitting unit numbered P+1, and the first input terminal of the driving circuit of the light emitting unit numbered P+1 receives a relay signal output by the output terminal of the driving circuit of the light emitting unit numbered P as the first input signal, N is an integer greater than 0, M is an integer greater than 0, $0<X\leq N$ and X is an integer, and $0<P<X*M$ and P is an integer.

For example, in the light emitting substrate provided by an embodiment of the present disclosure, in a same group of light emitting units, the X*M light emitting units are sequentially numbered row by row and column by column in a Z-shape, or sequentially numbered row by row and column by column in an S-shape.

For example, the light emitting substrate provided by an embodiment of the present disclosure further comprises a plurality of voltage transfer lines. The plurality of voltage transfer lines extend along the first direction and are configured to transmit the second input signal, and the plurality of voltage transfer lines are in one-to-one correspondence with N rows of light emitting units, and the second input terminal of the driving circuit is electrically connected with a voltage transfer line corresponding to the row of light emitting units comprising the driving circuit.

For example, the light emitting substrate provided by an embodiment of the present disclosure further comprises a plurality of source address lines and a plurality of source voltage lines extending in a second direction. The plurality of source address lines are electrically connected with the plurality of address transfer lines in one-to-one correspondence, and are configured to transmit the first input signal. The plurality of source voltage lines are in one-to-one correspondence with the plurality of groups of light emitting units, and each source voltage line is electrically connected with a plurality of voltage transfer lines corresponding to a corresponding group of light emitting units, and is configured to transmit the second input signal, and the first direction intersects with the second direction.

For example, in the light emitting substrate provided by an embodiment of the present disclosure, the source address lines and the source voltage lines are in a same layer, the voltage transfer lines and the address transfer lines are in a same layer, and the source address lines and the address transfer lines are in different layers.

For example, the light emitting substrate provided by an embodiment of the present disclosure further comprises a plurality of first test points, a plurality of second test points, a plurality of third test points, and a plurality of fourth test points. The plurality of first test points each are at one end of a source address line or a source voltage line that is away from the light emitting unit; the plurality of second test points each are at a connection position between the source address line and the address transfer line, and at a connection position between the source voltage line and a voltage transfer line having a distance farthest from a first test point among the voltage transfer lines connected with the source voltage line; the plurality of third test points are at both ends of the voltage transfer lines, and at an end of the address transfer line away from the light emitting unit; and the plurality of fourth test points each are at a connection position among connection positions between the source voltage lines and the voltage transfer lines except for positions where the second test points are located.

For example, in the light emitting substrate provided by an embodiment of the present disclosure, the plurality of source address lines are arranged along the first direction, lengths of the plurality of source address lines along the second direction are different from each other, and in two source address lines farthest apart along the first direction, a length of a source address line closer to a gate driving circuit in a display panel stacked on the light emitting substrate is less than a length of a source address line farther away from the gate driving circuit; and the plurality of source voltage lines are arranged along the first direction, lengths of the plurality of source voltage lines along the second direction are different from each other, and in two source voltage lines farthest apart along the first direction, a length of a source voltage line closer to the gate driving circuit is less than a length of a source voltage line farther away from the gate driving circuit.

For example, in the light emitting substrate provided by an embodiment of the present disclosure, the plurality of source address lines are parallel to each other, and the lengths of the plurality of source address lines arranged sequentially along the first direction change monotonously; and the plurality of source voltage lines are parallel to each other, and the lengths of the plurality of source voltage lines arranged sequentially along the first direction change monotonously.

For example, in the light emitting substrate provided by an embodiment of the present disclosure, a source address line and a source voltage line corresponding to a same group of light emitting units are arranged adjacent to each other.

For example, in the light emitting substrate provided by an embodiment of the present disclosure, the source voltage line does not overlap with the address transfer line.

For example, in the light emitting substrate provided by an embodiment of the present disclosure, the source address lines and the source voltage lines are in gaps of a plurality of columns of light emitting units.

For example, the light emitting substrate provided by an embodiment of the present disclosure further comprises a plurality of first driving voltage lines and a plurality of first common voltage lines extending along the second direction. The first driving voltage lines are electrically connected with a driving voltage terminal of each light emitting unit, and are configured to transmit a driving voltage. The driving circuit further comprises a common voltage terminal, and the first common voltage lines are electrically connected with the common voltage terminal of the driving circuit of each light emitting unit and are configured to transmit a common voltage.

For example, in the light emitting substrate provided by an embodiment of the present disclosure, the first driving voltage lines and the first common voltage lines are in a same layer, and are in a same layer as the source address lines and the source voltage lines.

For example, the light emitting substrate provided by an embodiment of the present disclosure further comprises a plurality of second driving voltage lines and a plurality of second common voltage lines extending along the first direction. The second driving voltage lines are electrically connected with the first driving voltage lines and form a grid-like trace, the second common voltage lines are electrically connected with the first common voltage lines and form a grid-like trace, and the second driving voltage lines and the second common voltage lines are in a same layer, and are in a same layer as the address transfer lines and the voltage transfer lines.

For example, in the light emitting substrate provided by an embodiment of the present disclosure, in a same light emitting unit, the plurality of light emitting elements are arranged in an array, and the driving circuit is in gaps of the plurality of light emitting elements.

For example, in the light emitting substrate provided by an embodiment of the present disclosure, the light emitting elements are micro light emitting diodes.

For example, the light emitting substrate provided by an embodiment of the present disclosure further comprises a flexible printed circuit board. The flexible printed circuit board overlaps and is electrically connected with the source address lines and the source voltage lines, and the first test points are on a side of the flexible printed circuit board away from the light emitting units.

At least one embodiment of the present disclosure further provides a display device, which comprises a display panel and the light emitting substrate provided by any one of the embodiments of the present disclosure. The display panel has a display side and a non-display side opposite to the display side, and the light emitting substrate is provided on the non-display side of the display panel as a backlight unit.

At least one embodiment of the present disclosure further provides a method of driving the light emitting substrate provided by any one of the embodiments of the present disclosure. The method comprises: supplying the first input signal and the second input signal, so that the output terminal outputs the relay signal in the first period, and the output terminal supplies, in the second period, the driving signal to the plurality of light emitting elements sequentially connected in series, so as to allow the plurality of light emitting elements to emit light under action of the driving signal in the second period.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

Figure 1:
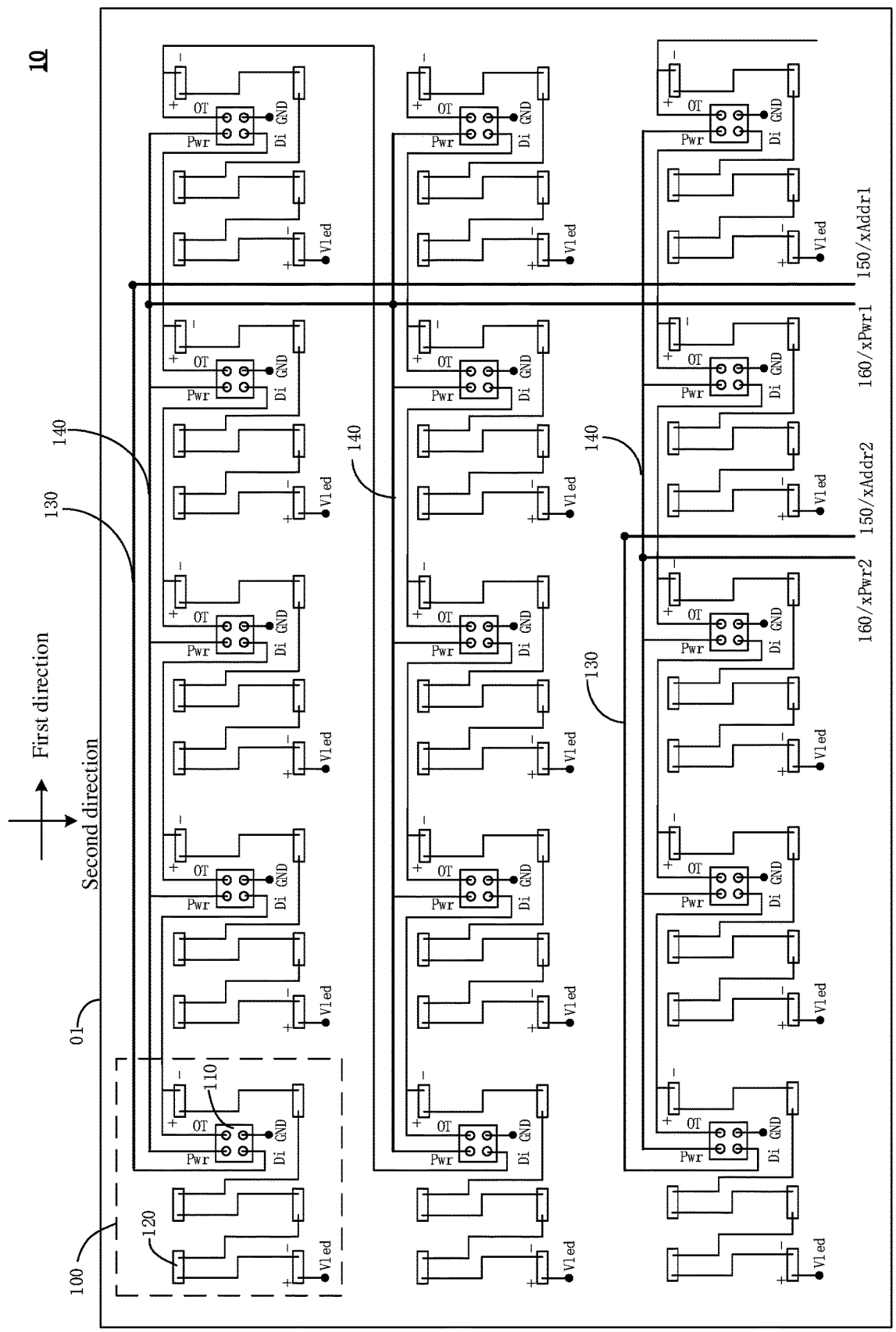
FIG. 1 is a schematic diagram of a light emitting substrate provided by some embodiments of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art may obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "comprise/comprising," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may comprise an electrical connection/coupling, directly or indirectly. The terms, "on," "under," "left," "right," or the like are only used to indicate relative position relationship, and when the position of the object which is described is changed, the relative position relationship may be changed accordingly.

Among display products using light emitting diodes, the mini light emitting diode (mini-LED) or the micro light emitting diode (micro-LED) is small in size and high in brightness, and may be widely used in backlight modules of display devices, to finely adjust backlight, so as to implement display of high-dynamic range (HDR) images. For example, a typical size (e.g., length) of a micro-LED is less than 50 microns, for example, 10 microns to 50 microns; and a typical size (e.g., length) of a mini-LED is 50 microns to 150 microns, for example, 80 microns to 120 microns. Due to the small size of the light emitting diode, when the light emitting diode is applied to the backlight module, a huge number of light emitting diodes are required. Moreover, because the light emitting diode is a current driving element, the signal line needs to transmit a current signal from a driving chip to the light emitting diode. If it is intended to independently control each light emitting diode in the backlight module, a large number of driving chips and dense signal lines need to be arranged accordingly, which leads to higher product costs. In addition, the chip area of the driving circuit is usually large, which may take up more space, thereby increasing the difficulty in product design and processing.

At least one embodiment of the present disclosure provides a light emitting substrate, a method of driving a light emitting substrate, and a display device. The light emitting substrate can implement partitioned independent control of light emission brightness with low power consumption, high integration, simple control mode, and can cooperate with a liquid crystal display device to implement high-contrast display.

Hereinafter, the embodiments of the present disclosure will be explained in detail with reference to the accompanying drawings. It should be noted that, same reference signs in different drawings will be used to refer to same elements that have been described.

At least one embodiment of the present disclosure provides a light emitting substrate, and the light emitting substrate includes a plurality of light emitting units arranged in an array. Each light emitting unit includes a driving circuit, a plurality of light emitting elements, and a driving voltage terminal. The driving circuit includes a first input terminal, a second input terminal and an output terminal; and the plurality of light emitting elements are sequentially connected in series and connected between the driving voltage terminal and the output terminal. The driving circuit is configured to output a relay signal through the output terminal in a first period according to a first input signal received by the first input terminal and a second input signal received by the second input terminal, and supply a driving signal to the plurality of light emitting elements sequentially connected in series through the output terminal in a second period.

Figure 2:
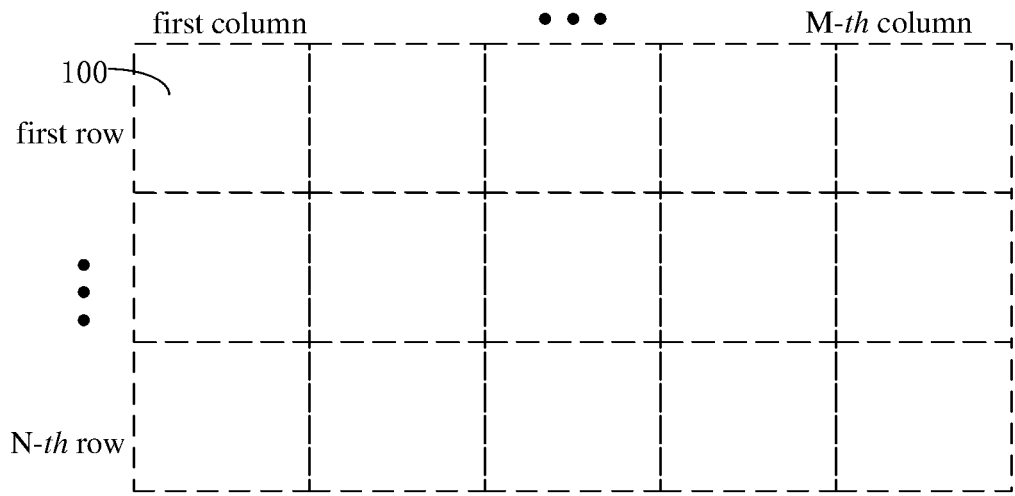
FIG. 2 is a schematic diagram of arrangement of light emitting units of the light emitting substrate shown in FIG. 1.

FIG. 1 is a schematic diagram of a light emitting substrate provided by some embodiments of the present disclosure, and FIG. 2 is a schematic diagram of arrangement of light emitting units of the light emitting substrate shown in FIG. 1. As shown in FIG. 1 and FIG. 2, a light emitting substrate 10 includes a base substrate 01 and a plurality of light emitting units 100 arranged in an array on the base substrate 01. For example, the plurality of light emitting units 100 are arranged in N rows and M columns, N is an integer greater than 0, and M is an integer greater than 0. For example, the number of the light emitting units 100 may be determined according to actual needs, for example, according to the size of the light emitting substrate 10 and required brightness. Although only 3 rows and 5 columns of light emitting units 100 are shown in FIG. 1, it should be understood that the number of light emitting units 100 is not limited thereto. For example, the base substrate 01 may be a plastic substrate, a silicon substrate, a ceramic substrate, a glass substrate, a quartz substrate, etc.; and the base substrate 01 includes a single-layer or multi-layer wires, which is not limited in the embodiments of the present disclosure.

For example, each row of light emitting units 100 are arranged along a first direction; and each column of light emitting units 100 are arranged along a second direction. For example, the first direction is a row direction and the second direction is a column direction. Of course, the embodiments of the present disclosure are not limited thereto, and the first direction and the second direction may be arbitrary directions, as long as the first direction and the second direction intersect with each other. Moreover, the plurality of light emitting units 100 are not limited to being arranged along a straight line, and they may also be arranged along a curve, in a ring, or in an arbitrary manner, which may be determined according to actual needs, and is not limited in the embodiments of the present disclosure.

Figure 3:
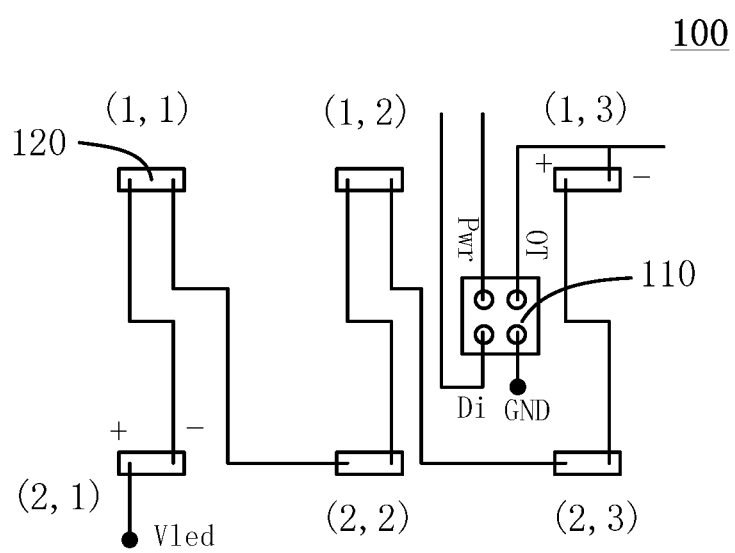
FIG. 3 is a schematic diagram of a light emitting unit in the light emitting substrate shown in FIG. 1.
Figure 4:
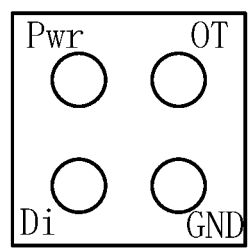
FIG. 4 is a schematic diagram of pins of a driving circuit in the light emitting unit of the light emitting substrate shown in FIG. 1.

FIG. 3 is a schematic diagram of a light emitting unit in the light emitting substrate shown in FIG. 1, and FIG. 4 is a schematic diagram of pins of a driving circuit in the light emitting unit of the light emitting substrate shown in FIG. 1. As shown in FIG. 1, FIG. 3 and FIG. 4, each light emitting unit 100 includes a driving circuit 110, a plurality of light emitting elements 120, and a driving voltage terminal Vled.

The driving circuit 110 includes a first input terminal Di, a second input terminal Pwr, an output terminal OT, and a common voltage terminal GND. The first input terminal Di receives a first input signal; and the first input signal is, for example, an address signal for turning on the driving circuit 110 of the corresponding address. For example, addresses of different driving circuits 110 may be the same or different. The first input signal may be an 8-bit address signal, and an address to be transmitted may be obtained by parsing the address signal. The second input terminal Pwr receives a second input signal, and the second input signal is, for example, a power line carrier communication signal. For example, the second input signal not only supplies electric power to the driving circuit 110, but also transmits communication data to the driving circuit 110, and the communication data can be used to control light emission duration of a corresponding light emitting unit 100, so as to further control visual light emission brightness thereof. The output terminal OT can respectively output different signals in different periods, for example, respectively output a relay signal and a driving signal. For example, the relay signal is an address signal supplied to other driving circuit 110, that is, the first input terminal Di of other driving circuit 110 receives the relay signal as the first input signal, so as to acquire the address signal. For example, the driving signal may be a driving current for driving the light emitting element 120 to emit light. The common voltage terminal GND receives a common voltage signal, for example, a ground signal.

The driving circuit 110 is configured to output the relay signal through the output terminal OT in the first period according to the first input signal received by the first input terminal Di and the second input signal received by the second input terminal Pwr, and supply the driving signal to the plurality of light emitting elements 120 sequentially connected in series through the output terminal OT in the second period. In the first period, the output terminal OT outputs the relay signal, and the relay signal is supplied to other driving circuit 110 so that other driving circuit 110 acquires the address signal. In the second period, the output terminal OT outputs the driving signal, and the driving signal is supplied to the plurality of light emitting elements 120 sequentially connected in series, so that the light emitting elements 120 emit light in the second period. For example, the first period and the second period are different periods, and the first period, for example, may be earlier than the second period. The first period may be continuously connected with the second period, and the end moment of the first period is the start moment of the second period; or, there may be other period between the first period and the second period, and the other period may be used to implement other required functions, or the other period may also be used only to separate the first period and the second period, so as to prevent signals of the output terminal OT in the first period and the second period from interfering with each other. The operation principle of the driving circuit 110 will be described in detail later, and no details will be repeated here.

It should be noted that, in the case where the driving signal is a driving current, the driving current may flow from the output terminal OT into the light emitting element 120, or may flow from the light emitting element 120 into the output terminal OT. The flow direction of the driving current may be determined according to actual needs, which is not limited in the embodiments of the present disclosure. Herein, the expression that "the output terminal OT outputs a driving signal" indicates that the output terminal OT supplies the driving signal, and the driving signal may either flow in a direction out from the output terminal OT or flow in a direction into the output terminal OT.

For example, as shown in FIG. 1 and FIG. 3, the plurality of light emitting elements 120 are sequentially connected in series and connected in series between the driving voltage terminal Vled and the output terminal OT. For example, the light emitting element 120 may be a micro light emitting diode (micro-LED) or a mini light emitting diode (mini-LED). For example, each light emitting element 120 includes a positive electrode (+) and a negative electrode (−) (or, which may also be referred to as an anode and a cathode); and positive electrodes and negative electrodes of the plurality of light emitting elements 120 are sequentially connected in series head to tail, so that a current path is formed between the driving voltage terminal Vled and the output terminal OT. The driving voltage terminal Vled supplies a driving voltage, for example, a high voltage during a period (the second period) in which the light emitting element 120 needs to emit light, and a low voltage in the other period. Thus, in the second period, the driving signal (e.g., the driving current) flows from the driving voltage terminal Vled sequentially through the plurality of light emitting elements 120, and then flows into the output terminal OT of the driving circuit 110. The plurality of light emitting elements 120 emit light when the driving current flows through; and by controlling duration of the driving current, light emission duration of the light emitting elements 120 may be controlled, thereby controlling visual light emission brightness.

For example, as shown in FIG. 1 and FIG. 3, in some examples, one light emitting unit 100 includes 6 light emitting elements 120, and the 6 light emitting elements 120 are arranged in 2 rows and 3 columns. For example, the 6 light emitting elements 120 are sequentially numbered as (1, 1), (1, 2), (1, 3), (2, 1), (2, 2) and (2, 3) in a manner from left to right and from top to bottom, and the serial numbers are shown in FIG. 3. For example, in the case where the 6 light emitting elements 120 are connected in series, the light emitting element 120 in position (2, 1) is used as a start point of the serial connection, and light emitting elements 120 in positions (1, 1), (2, 2), (1, 2), (2, 3) and (1, 3) are connected sequentially, with the light emitting element 120 in position (1, 3) as an end point of the serial connection. For example, the positive electrode of the light emitting element 120 in position (2, 1) is connected with the driving voltage terminal Vled, and the negative electrode of the light emitting element 120 in position (1, 3) is connected with the output terminal OT of the driving circuit 110. Such a distribution mode and serial connection mode may effectively avoid overlapping of traces, and facilitate design and manufacturing. Moreover, bending shapes and lengths of traces between two arbitrary adjacent light emitting elements 120 on the series path are approximately the same, so that resistance of the trace itself is relatively balanced, which can improve load balance and improve stability of the circuit.

Figure 5:
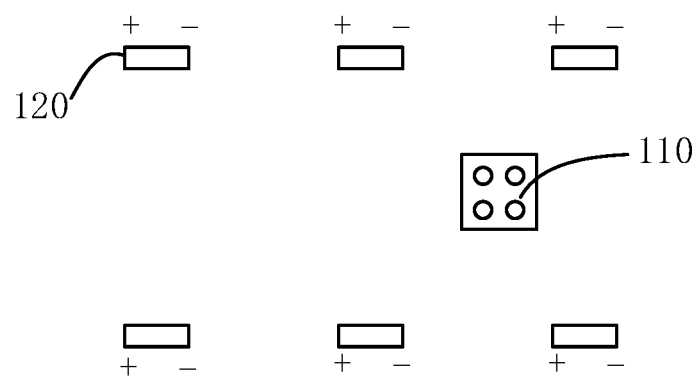
FIG. 5 is a schematic diagram of arrangement of the light emitting elements and the driving circuit in the light emitting unit of the light emitting substrate shown in FIG. 1.

FIG. 5 is a schematic diagram of arrangement of light emitting elements and the driving circuit in the light emitting unit of the light emitting substrate shown in FIG. 1. As shown in FIG. 5, in a same light emitting unit 100, the plurality of (e.g., 6) light emitting elements 120 are arranged in an array, for example, arranged in a plurality of rows and a plurality of columns, so that light emission may be more uniform. The driving circuit 110 is located in the gap of the array constituted by the plurality of light emitting elements 120.

It should be noted that, in the embodiments of the present disclosure, the number of light emitting elements 120 in each light emitting unit 100 is not limited, and may be any number such as 4, 5, 7, 8, etc., and is not limited to 6. The plurality of light emitting elements 120 may be arranged in any manner, for example, in a desired pattern, and is not limited to arrangement in a matrix. The arrangement position of the driving circuit 110 is not limited, and the driving circuit 110 may be arranged in any gap between light emitting elements 120, which may be determined according to actual needs, and is not limited in the embodiments of the present disclosure.

The operation principle of the driving circuit 110 is briefly described below.

Figure 6A:
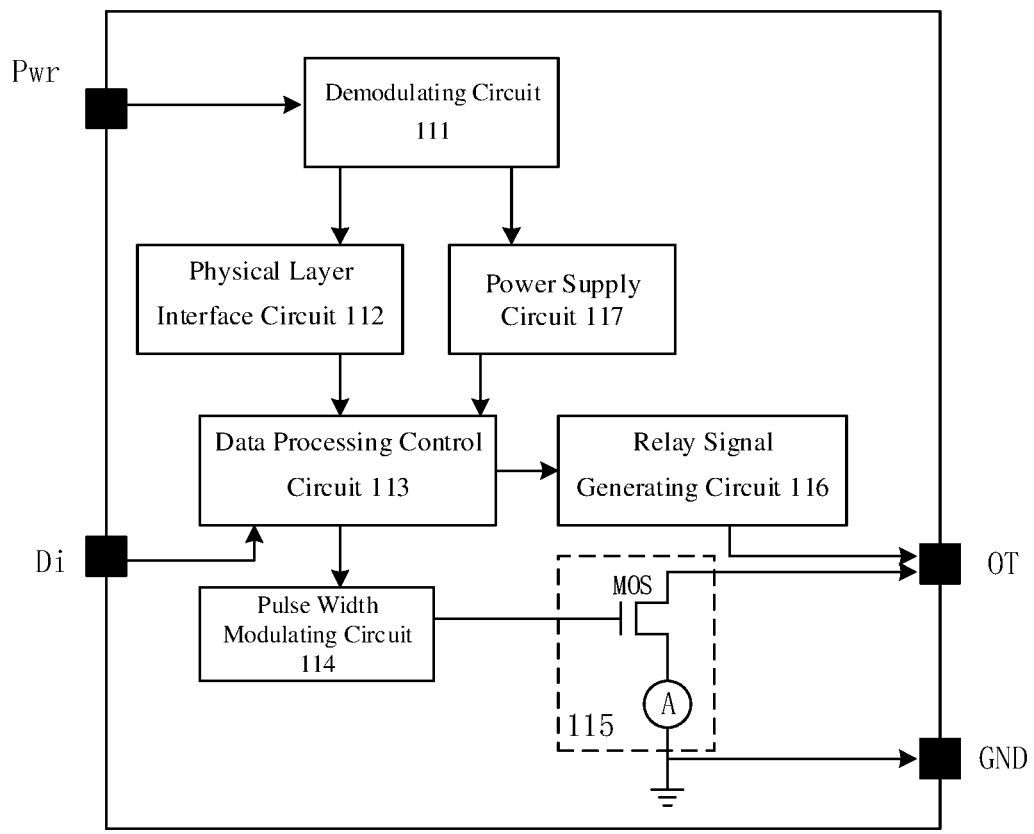
FIG. 6A is a schematic block diagram of principle of a driving circuit in a light emitting unit of a light emitting substrate provided by some embodiments of the present disclosure.

FIG. 6A is a schematic block diagram of principle of a driving circuit in a light emitting unit of a light emitting substrate provided by some embodiments of the present disclosure. As shown in FIG. 6A, the driving circuit 110 includes a demodulating circuit 111, a physical layer interface circuit 112, a data processing control circuit 113, a pulse width modulating circuit 114, a driving signal generating circuit 115, a relay signal generating circuit 116, and a power supply circuit 117.

For example, the demodulating circuit 111 is electrically connected with the second input terminal Pwr and the physical layer interface circuit 112, and is configured to demodulate the second input signal to obtain communication data, and transmit the communication data to the physical layer interface circuit 112. For example, the second input signal input by the second input terminal Pwr is a power line carrier communication signal, and the power line carrier communication signal contains information corresponding to the communication data. For example, the communication data is data representing light emission duration, which in turn represents required light emission brightness. As compared with the usual serial peripheral interface (SPI) protocol, the power line carrier communication (PLC) protocol which is adopted by the embodiments of the present disclosure superimposes the communication data on the power signal, thereby effectively reducing the number of signal lines.

Figure 6B:
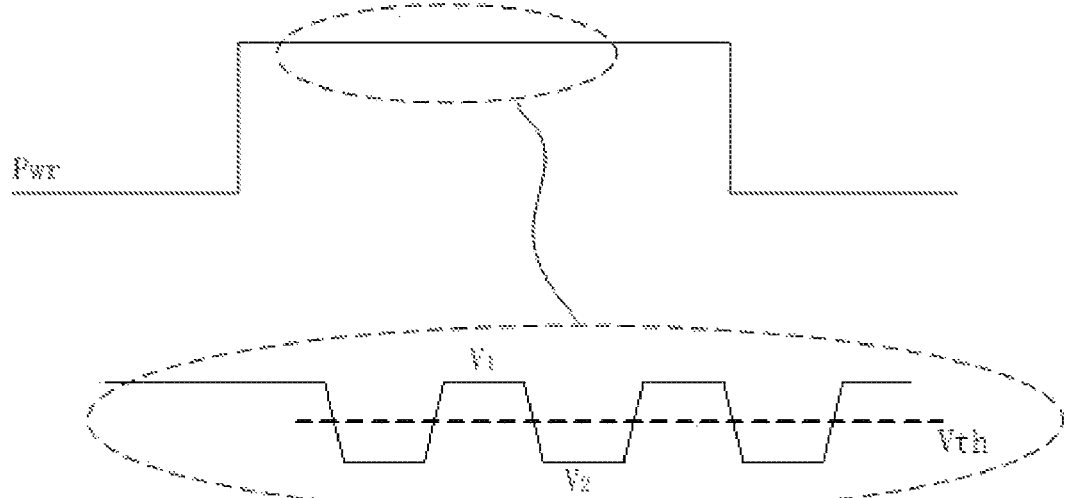
FIG. 6B is a waveform diagram of a second input signal in the driving circuit shown in FIG. 6A.

FIG. 6B is a waveform diagram of the second input signal in the driving circuit shown in FIG. 6A. As shown in FIG. 6B, the dashed oval frame represents an enlarged view of a corresponding waveform. When the second input signal is at high level, the high level amplitude thereof fluctuates around the threshold amplitude Vth, for example, varies between a first amplitude $V_1$ and a second amplitude $V_2$, and $V_2<Vth<V_1$. By modulating the variation rule of the first amplitude $V_1$ and the second amplitude $V_2$, the communication data can be modulated into the second input signal, so that the second input signal transmits information corresponding to the communication data while transmitting electric energy. For example, the demodulating circuit 111 filters out the direct current power component of the second input signal, so that the communication data can be obtained. For detailed description of the second input signal, the conventional power line carrier communication signal may be referred to, and no details will be repeated here. Correspondingly, for detailed description of the demodulating circuit 111, the demodulating circuit of the conventional power line carrier communication signal may also be referred to, and no details will be repeated here.

For example, the physical layer interface circuit 112 is also electrically connected with the data processing control circuit 113, and is configured to process the communication data to obtain a data frame (e.g., frame rate data), and transmit the data frame to the data processing control circuit 113. The data frame obtained by the physical layer interface circuit 112 contains information that needs to be transmitted to the driving circuit 110, for example, information related to light emission duration (e.g., specific light emission duration). For example, the physical layer interface circuit 112 may be a common port physical (PHY) layer, for detailed description, the conventional design may be referred to, and no details will be repeated here.

For example, the data processing control circuit 113 is also electrically connected with the first input terminal Di, the pulse width modulating circuit 114, and the relay signal generating circuit 116. The data processing control circuit 113 is configured to generate a pulse width control signal based on the data frame and transmit the pulse width control signal to the pulse width modulating circuit 114, and generate a relay control signal based on the first input signal and transmit the relay control signal to the relay signal generating circuit 116. For example, according to the data frame, required light emission duration of the light emitting element 120 connected with the driving circuit 110 may be known, so a corresponding pulse width control signal is generated based on the light emission duration. For example, the relay control signal is a signal generated after the data processing control circuit 113 processes the first input signal. By processing the first input signal (e.g., parsing, latching, decoding, etc.), an address signal corresponding to the driving circuit 110 may be known, a relay control signal corresponding to a subsequent address may be generated, and the subsequent address corresponds to other driving circuit 110. For example, the data processing control circuit 113 may be implemented as a single-chip microcomputer, a central processing unit (CPU), a digital signal processor, etc.

For example, the pulse width modulating circuit 114 is also electrically connected with the driving signal generating circuit 115, and is configured to generate a pulse width modulating signal in response to the pulse width control signal, and transmit the pulse width modulating signal to the driving signal generating circuit 115. For example, the pulse width modulating signal generated by the pulse width modulating circuit 114 corresponds to the light emission duration required by the light emitting element 120, for example, effective pulse width duration is equal to the light emission duration required by the light emitting element 120. For example, for detailed description of the pulse width modulating circuit 114, the conventional pulse width modulating circuit may be referred to, and no details will be repeated here.

For example, the driving signal generating circuit 115 is also electrically connected with the output terminal OT, and is configured to generate a driving signal in response to the pulse width modulating signal, and output the driving signal through the output terminal OT. Here, outputting the driving signal through the output terminal OT may indicate that the driving signal (e.g., the driving current) flows from the output terminal OT to the light emitting element 120, or may also indicate that the driving signal (e.g., driving current) flows from the light emitting element 120 into the output terminal OT, and the specific current direction is not limited.

For example, in some examples, in the case where the driving signal is a driving current, the driving signal generating circuit 115 may include a current source A and a metal oxide semiconductor (MOS) field effect transistor (FET), and the metal oxide semiconductor field effect transistor is referred to as a MOS transistor. A control electrode of the MOS transistor receives the pulse width modulating signal transmitted by the pulse width modulating circuit 114, and is turned on or off under control of the pulse width modulating signal. A first electrode of the MOS transistor is connected with the output terminal OT; a second electrode of the MOS transistor is connected with a first electrode of the current source A; and a second electrode of the current source A is connected with the common voltage terminal GND to receive a common voltage. For example, the current source A may be a constant current source.

When the pulse width modulating signal is at active level, the MOS transistor is turned on, and the current source A supplies a driving current through the output terminal OT. When the pulse width modulating signal is at inactive level, the MOS transistor is turned off, and the output terminal OT does not supply a driving current at this time. Active level duration of the pulse width modulating signal is equal to ON-duration of the MOS transistor; and the ON-duration of the MOS transistor is equal to duration that the output terminal OT supplies the driving current. In this way, the light emission duration of the light emitting element 120 may be further controlled, and thus the visual light emission brightness may be further controlled. For example, in some examples, when the MOS transistor is turned on, the driving current flows from the output terminal OT into the driving circuit 110, and sequentially flows through the MOS transistor and the current source A, and then flows into a ground end (e.g., the common voltage terminal GND). It should be noted that, in the embodiments of the present disclosure, the driving signal generating circuit 115 may also adopt other circuit structure forms, which is not limited in the embodiments of the present disclosure.

For example, the relay signal generating circuit 116 is also electrically connected with the output terminal OT, and is configured to generate a relay signal based on the relay control signal, and output the relay signal through the output terminal OT. For example, the relay control signal corresponds to a subsequent address; the relay signal generated based on the relay control signal contains the subsequent address; and the subsequent address corresponds to other driving circuit 110. After being output from the output terminal OT, the relay signal is supplied to a first input terminal Di of a separately provided driving circuit 110; and the relay signal is input to the separately provided driving circuit 110 as the first input signal, so that the separately provided driving circuit 110 acquires the corresponding address signal. The relay signal generating circuit 116 may be implemented by a latch, a decoder, an encoder, etc., which is not limited in the embodiments of the present disclosure.

It should be noted that, in the embodiments of the present disclosure, although the driving signal generating circuit 115 and the relay signal generating circuit 116 are both electrically connected with the output terminal OT, the driving signal generating circuit 115 and the relay signal generating circuit 116 respectively output the driving signal and the relay signal in different periods, and the driving signal and the relay signal are transmitted through the output terminal OT in a time sharing manner, so they do not affect each other.

For example, the power supply circuit 117 is electrically connected with the demodulating circuit 111 and the data processing control circuit 113, respectively, and is configured to receive electric energy and supply power to the data processing control circuit 113. For example, the second input signal is a power line carrier communication signal. After being demodulated by the demodulating circuit 111, the direct current power component (i.e., electric energy) in the second input signal is transmitted to the power supply circuit 117, and is then supplied by the power supply circuit 117 to the data processing control circuit 113. Of course, the embodiments of the present disclosure are not limited thereto, and the power supply circuit 117 may also be electrically connected with other circuit in the driving circuit 110 to supply electric energy. The power supply circuit 117 may be implemented by a switch circuit, a voltage conversion circuit, a voltage stabilizing circuit, etc., which is not limited in the embodiments of the present disclosure.

It should be noted that, in the embodiments of the present disclosure, the driving circuit 110 may also include more circuits and components, and is not limited to the demodulating circuit 111, the physical layer interface circuit 112, the data processing control circuit 113, the pulse width modulating circuit 114, the driving signal generating circuit 115, the relay signal generating circuit 116, and the power supply circuit 117 as described above, which may be determined according to functions that need to be implemented, and may not be limited in the embodiments of the present disclosure.

Figure 6C:
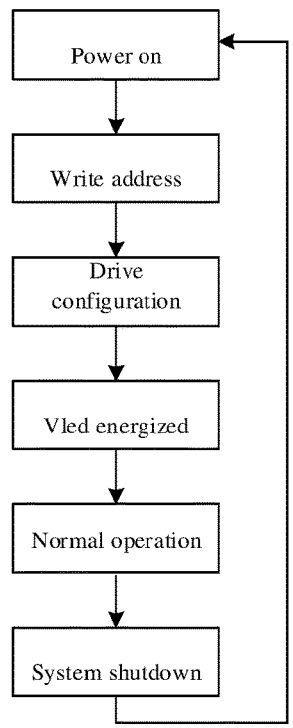
FIG. 6C is a schematic diagram of an operation flow of the driving circuit shown in FIG. 6A.
Figure 6D:
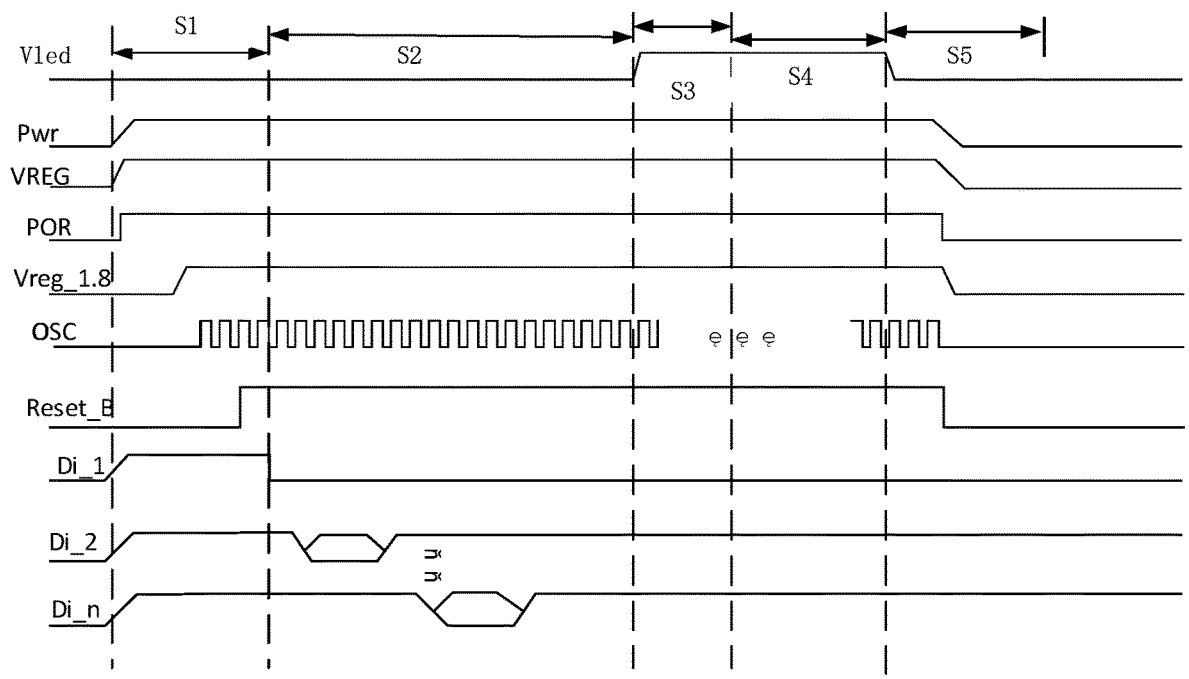
FIG. 6D is a signal timing diagram of the driving circuit shown in FIG. 6A.

FIG. 6C is a schematic diagram of operation flow of the driving circuit shown in FIG. 6A, and FIG. 6D is a signal timing diagram of the driving circuit shown in FIG. 6A.

As shown in FIG. 6C and FIG. 6D, when the driving circuit 110 is operating, it is firstly powered on (i.e., energized) to complete initialization, and then an address writing operation is performed in period S1, that is, in period S1, a first input signal Di_1 is input into the driving circuit 110 through the first input terminal Di to write an address. For example, the first input signal Di_1 is sent through a separately provided transmitter.

Next, in period S2, drive configuration is performed, and a relay signal Di_2 is output through the output terminal OT. For example, the relay signal Di_2 is input as a first input signal to a first input terminal Di of a separately provided driving circuit 110. For example, the foregoing first period is period S2.

Then, in period S3, the driving voltage terminal Vled is energized. For example, after a plurality of driving circuits 110 all acquire corresponding addresses, it enters period S3 after an interval of about 10 microseconds. At this time, the driving voltage supplied by the driving voltage terminal Vled becomes a high level.

Then, in period S4, the driving circuit 110 is in a normal operation mode, and the output terminal OT supplies a driving signal (e.g., a driving current) according to required duration, so that the light emitting elements 120 connected with the driving circuit 110 emit light according to the required duration. For example, the foregoing second period is period S4. For example, in the case where the light emitting substrate 10 serves as the backlight unit of a display device, the light emitting substrate 10 adopting the driving circuit 110 operates in a local dimming mode, which may achieve a high dynamic range effect.

Finally, in period S5, the system is shut down, that is, the driving circuit 110 is powered off, the driving voltage supplied by the driving voltage terminal Vled becomes a low level, and the light emitting elements 120 stop emitting light.

It should be noted that, the above-described operation flow is only illustrative and not limitative. The actual operation flow of the driving circuit 110 may be determined according to actual needs, and is not limited in the embodiments of the present disclosure. In FIG. 6D, VREG, POR, Vreg_1.8, OSC, and Reset_B are all internal signals of the driving circuit 110, which are not input or output through the first input terminal Di, the second input terminal Pwr, the output terminal OT, and the common voltage terminal GND. Di_1 is the first input signal received by the driving circuit 110; Di_2 is the relay signal output by the driving circuit 110 (i.e., the first input signal received by the next driving circuit 110 connected); and Di_n is the first input signal received by the n-th driving circuit 110 in the plurality of driving circuits 110 sequentially connected.

For example, the driving circuit 110 may be implemented as a chip, with a chip size (e.g., length) of tens of microns and a chip area of about a few hundred square microns or even smaller, which is similar to a mini-LED in size, has a miniaturization characteristic, and is easy to be integrated into the light emitting substrate 10 (e.g., be soldered in the light emitting substrate 10) without being arranged outside the light emitting substrate 10 by bonding, thereby saving the arrangement space of the printed circuit board, simplifying the structure, and facilitating implementation of lightness and thinness. Each driving circuit 110 directly drives one light emitting unit 100, which avoids problems such as complicated operation and easy flicker in a row scanning control mode. In addition, the driving circuit 110 has a small number of ports, a small number of required signals, a simple control mode, a simple wiring mode, and low costs.

For example, as shown in FIG. 1, the light emitting substrate 10 further includes a plurality of address transfer lines 130, and the plurality of address transfer lines 130 extend in a first direction and are configured to transmit the first input signal.

For example, the plurality of light emitting units 100 in the light emitting substrate 10 are arranged in N rows and M columns and are divided into a plurality of groups. Each group of light emitting units 100 include X rows and M columns, a total of X*M light emitting units 100; and the plurality of address transfer lines 130 are in one-to-one correspondence with the plurality of groups of light emitting units 100. In this case, the light emitting units 100 are divided into N/X groups. For example, in the example shown in FIG. 1, each group of light emitting units 100 include 2 rows and 5 columns, a total of 10 light emitting units 100, so, every 2 rows of light emitting units 100 correspond to one address transfer line 130; and the number of address transfer lines 130 in the light emitting substrate 10 is N/2. For example, N is an integer greater than 0, M is an integer greater than 0, $0<X \leq N$ and X is an integer.

Figure 7A:
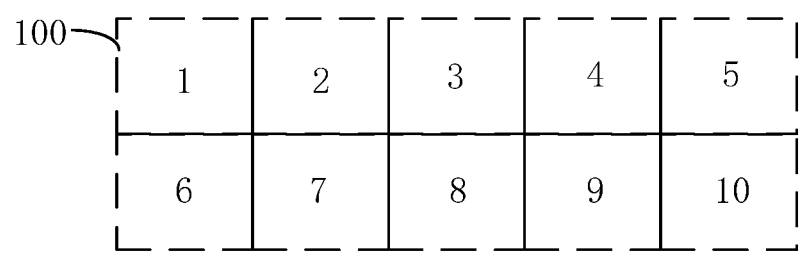
FIG. 7A and FIG. 7B are schematic diagrams of numbering of light emitting units of a light emitting substrate provided by some embodiments of the present disclosure.
Figure 7B:
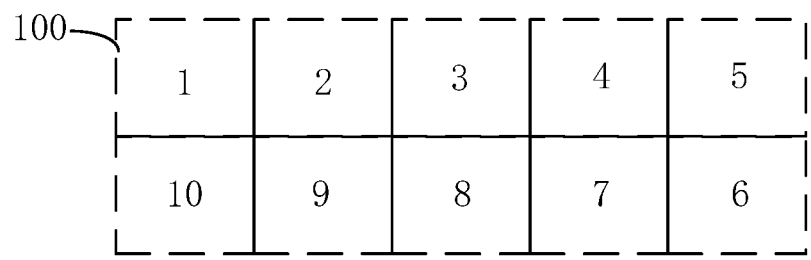

For example, in a same group of light emitting units 100, X*M light emitting units 100 are sequentially numbered according to row and column distribution positions. For example, in some examples, as shown in FIG. 7A, the X*M light emitting units are sequentially numbered row by row and column by column in a Z-shape, each rectangle in FIG. 7A represents one light emitting unit 100, and the serial number of each light emitting unit 100 is marked in each rectangle. For example, in other examples, as shown in FIG. 7B, the X*M light emitting units are sequentially numbered row by row and column by column in an S-shape; similarly, each rectangle in FIG. 7B represents one light emitting unit 100, and the serial number of each light emitting unit 100 is marked in each rectangle. It should be noted that, the mode in which the light emitting units 100 are sequentially numbered according to the row and column distribution positions is not limited to the mode as described above, and they may also be numbered in other mode, so that the connection mode of the plurality of light emitting units 100 may be flexibly adjusted, which is not limited in the embodiments of the present disclosure.

For example, as shown in FIG. 1, in a same group of light emitting units 100, the first input terminal Di of the driving circuit 110 of the light emitting unit 100 numbered 1 is electrically connected with an address transfer line 130 corresponding to the group of light emitting units 100; the output terminal OT of the driving circuit 110 of the light emitting unit 100 numbered P is electrically connected with the first input terminal Di of the driving circuit 110 of the light emitting unit 100 numbered P+1; and the first input terminal Di of the driving circuit 110 of the light emitting unit 100 numbered P+1 receives the relay signal output by the output terminal OT of the driving circuit 110 of the light emitting unit 100 numbered P as the first input signal. For example, $0<P<X*M$ and P is an integer.

For example, in the case where the numbering mode shown in FIG. 7A is adopted, with respect to the group of light emitting units 100 numbered 1 (i.e., the group of light emitting units 100 on the uppermost side of the light emitting substrate 10, or referred to as the first group of light emitting units 100), the first input terminal Di of the driving circuit 110 of the light emitting unit 100 located in the first row and the first column is electrically connected with the address transfer line 130 corresponding to the group of light emitting units 100; and output terminals OT of driving circuits 110 of respective light emitting units 100 are electrically connected with the first input terminal Di of the driving circuit 110 of a next light emitting unit 100 (the output terminal OT of the driving circuit 110 of the last light emitting unit 100 is not connected with other driving circuit 110). With respect to the group of light emitting units 100 numbered 2 (i.e., the group of light emitting units 100 closely adjacent to the first group of light emitting units 100, or referred to as the second group of light emitting units 100), the first input terminal Di of the driving circuit 110 of the light emitting unit 100 located in the third row and the first column is electrically connected with the address transfer line 130 corresponding to the group of light emitting units 100; and output terminals OT of driving circuits 110 of respective light emitting units 100 are electrically connected with the first input terminal Di of the driving circuit 110 of a next light emitting unit 100, and the connection mode is similar to that of the first group of light emitting units 100.

Through the above-described connection mode, in each group of light emitting units 100, only the first input terminal Di of the driving circuit 110 of the first light emitting unit 100 is electrically connected with the address transfer line 130, while the first input terminal Di of the driving circuit 110 of other light emitting unit 100 receives the relay signal output by the driving circuit 110 of a previous light emitting unit 100 as the first input signal. Therefore, with respect to one group of light emitting units 100, it is only necessary to supply one first input signal (i.e., the address signal) through one address transfer line 130, so that all light emitting units 100 in the group of light emitting units 100 may obtain their respective address signals. This greatly reduces the number of signal lines, saves wiring space, and simplifies the control mode.

For example, as shown in FIG. 1, the light emitting substrate 10 further includes a plurality of voltage transfer lines 140. The plurality of voltage transfer lines 140 extend along the first direction and are configured to transmit the second input signal, and the plurality of voltage transfer lines 140 are in one-to-one correspondence with N rows of light emitting units. For example, each row of light emitting units 100 correspond to one voltage transfer line 140; and the number of voltage transfer lines 140 in the light emitting substrate 10 is N. For example, as shown in FIG. 1, the first row of light emitting units 100, the second row of light emitting units 100, and the third row of light emitting units 100 each correspond to one voltage transfer line 140.

For example, with respect to a row of light emitting units 100, second input terminals Pwr of driving circuits 110 in the light emitting units 100 are electrically connected with a voltage transfer line 140 corresponding to the row of light emitting units 100 including the driving circuits 110. That is, second input terminals Pwr of all driving circuits 110 in a row of light emitting units 10 are electrically connected with a voltage transfer line 140 corresponding to the row so as to receive the second input signal.

For example, as shown in FIG. 1, the light emitting substrate 10 further includes a plurality of source address lines 150 and a plurality of source voltage lines 160 extending in the second direction.

For example, the plurality of source address lines 150 are electrically connected with the plurality of address transfer lines 130 in one-to-one correspondence, and are configured to transmit the first input signal. For example, the number of source address lines 150 is equal to the number of address transfer lines 130, and both are equal to N/X, that is, in the case where the light emitting units 100 are divided into N/X groups, each group of light emitting units 100 corresponds to one source address line 150 and one address transfer line 130; and the source address line 150 and the address transfer line 130 transmit the first input signal to the first light emitting unit 100 in the group of light emitting units 100. For example, as shown in FIG. 1, a source address line xAddr1 transmits a first input signal for the first group of light emitting units 100, and a source address line xAddr2 transmits a first input signal for the second group of light emitting units 100.

For example, the plurality of source voltage lines 160 are in one-to-one correspondence with the plurality of groups of light emitting units 100; and each source voltage line 160 is electrically connected with a plurality of voltage transfer lines 140 corresponding to a corresponding group of light emitting units 100, and is configured to transmit the second input signal. For example, the number of source voltage lines 160 is N/X, that is, in the case where the light emitting units 100 are divided into N/X groups, each group of light emitting units 100 correspond to one source voltage line 160; and the source voltage line 160 transmits the second input signal to a plurality of voltage transfer lines 140 corresponding to the group of light emitting units 100, so as to supply the second input signal to all the light emitting units 100 in the group of light emitting units 100. For example, a source address line 150 and a source voltage line 160 corresponding to a same group of light emitting units 100 are arranged adjacent to each other.

For example, as shown in FIG. 1, the source voltage line xPwr1 is electrically connected with two voltage transfer lines 140 corresponding to the first group of light emitting units 100, so as to supply a second input signal to the first row and the second row of light emitting units 100; and the source voltage line xPwr2 is electrically connected with two voltage transfer lines 140 corresponding to the second group of light emitting units 100, so as to supply a second input signal to the third row and the fourth row of light emitting units 100 (the fourth row of light emitting units 100 and the corresponding voltage transfer line 140 are not shown in the figure).

It should be noted that, in a same group of light emitting units 100, second input terminals Pwr of driving circuits 110 of all the light emitting units 100 are electrically connected with corresponding voltage transfer lines 140; and these voltage transfer lines 140 are connected with a same source voltage line 160. Therefore, with respect to a group of light emitting units 100, it is only necessary to supply one second input signal through one source voltage line 160, so that all the light emitting units 100 in the group of light emitting units 100 may obtain the second input signal. This greatly reduces the number of signal lines, saves wiring space, and simplifies the control mode.

For example, in the light emitting substrate 10, the number of source address lines 150 and the number of source voltage lines 160 are both N/X.

For example, in some examples, on the base substrate 01, the source address line 150 and the source voltage line 160 are located in a same layer; the voltage transfer line 140 and the address transfer line 130 are located in a same layer; and the source address line 150 and the address transfer line 130 are located in different layers. That is, the source address line 150 and the source voltage line 160 are manufactured by one patterning process (e.g., photoetching process); the voltage transfer line 140 and the address transfer line 130 are manufactured by another patterning process; an insulating layer is provided between the film layer where the source address line 150 and the source voltage line 160 are located and the film layer where the voltage transfer line 140 and the address transfer line 130 are located; and corresponding traces are electrically connected through a via hole penetrating through the insulating layer. Such mode can simplify the manufacturing process, and can be compatible with the usual semiconductor film layer manufacturing process, and improve production efficiency.

In the embodiments of the present disclosure, the light emitting units 100 are divided into a plurality of groups; and light emission brightness of each group of light emitting units 100 can be separately controlled by using the above-described connection mode. For example, by setting first input signals and second input signals supplied to respective groups of light emitting units 100, light emission duration of the respective groups of light emitting units 100 is controlled, so as to further control visual light emission brightness; and the light emission duration of the respective groups of light emitting units 100 may be the same or different, which may be determined according to usage mode and needs. The first input signals supplied to the respective groups of light emitting units 100 are independent of each other, and the second input signals supplied to the respective groups of light emitting units 100 are independent of each other, so light emission brightness of respective groups of light emitting units 100 can be independently controlled. The light emitting substrate 10 can implement partitioned independent control of light emission brightness, and has a wide range of applications. In addition, the number of ports of the driving circuits 110 is small, and the number of control signals required is small, so the control mode is simple, with less power consumption, and a convenient operation. The light emitting substrate 10 has a high degree of integration, and may cooperate with a liquid crystal display device to implement high-contrast display.

Figure 8A:
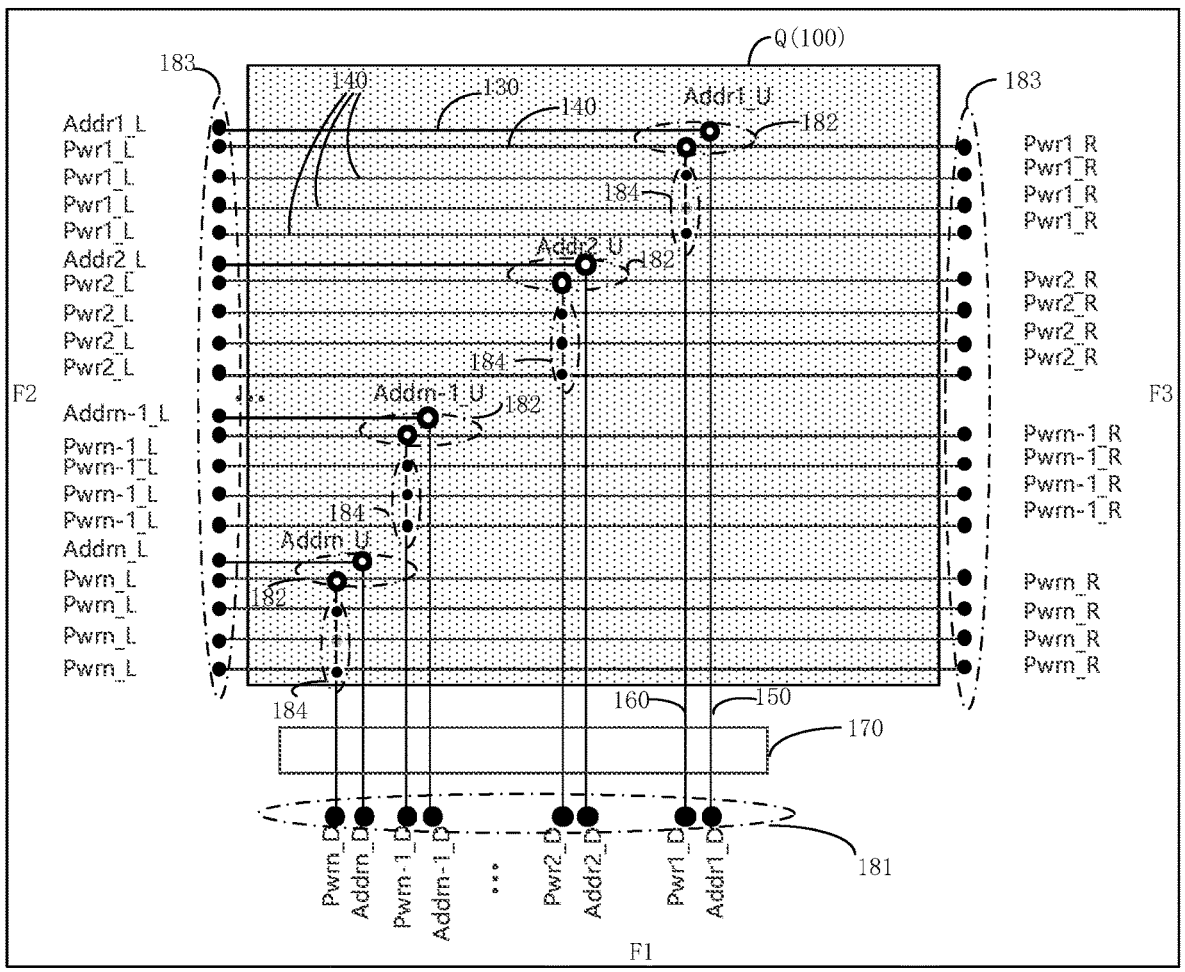
FIG. 8A is a schematic diagram of test points of a light emitting substrate provided by some embodiments of the present disclosure.

FIG. 8A is a schematic diagram of test points of a light emitting substrate provided by some embodiments of the present disclosure. For example, as shown in FIG. 8A, in some embodiments, the light emitting substrate 10 further includes a plurality of first test points 181, a plurality of second test points 182, a plurality of third test points 183, and a plurality of fourth test points 184. For example, the plurality of light emitting units 100 are mainly distributed in region Q. It should be noted that, it may be that all the light emitting units 100 are located in region Q, or that most of the light emitting units 100 are located in region Q, and the remaining light emitting units 100 are located around region Q. That is, region Q represents an approximate distribution region of a plurality of light emitting units 100 of which the number exceeds at least 70% of the total number.

For example, the plurality of first test points 181 each are located at one end of the source address line 150 or the source voltage line 160 away from the light emitting unit 100. The plurality of second test points 182 each are located at a connection position between the source address line 150 and the address transfer line 130, and located at a connection position between the source voltage line 160 and a voltage transfer line 140 having a distance farthest from the first test point 181 among the voltage transfer lines 140 connected with the source voltage line 160. The plurality of third test points 183 are located at both ends of the voltage transfer lines 140, and each located at an end of the address transfer line 130 away from the light emitting unit 100. The plurality of fourth test points 184 each are located at a connection position among connection positions between the source voltage lines 160 and the voltage transfer lines 140 except for positions where the second test points 182 are located. For example, in some examples, as shown in FIG. 8A, the first test points 181 are located on a first side F1 of the light emitting substrate 10; the second test points 182 and the fourth test points 184 are located in a middle region of the light emitting substrate 10; and the third test points 183 are located on a second side F2 and a third side F3 of the light emitting substrate 10.

In the manufacturing process of a mini-LED backlight, the address transfer line 130 and the voltage transfer line 140 are located in a same layer, the source address line 150 and the source voltage line 160 are located in a same layer, the two film layers are different layers, and corresponding traces are electrically connected through a via hole. However, during the manufacturing process, due to process limitations or other factors, there may be an open circuit and a short circuit of respective signal lines, which may cause the light emitting substrate to fail to operate normally; and in the case where the faulty light emitting substrate is put into a subsequent process without detection, it may cause a waste of production resources.

Therefore, by setting the first test point 181, the second test point 182, the third test point 183, and the fourth test point 184, the open circuit and the short circuit of the signal lines during the preparation process and before shipment may be timely and conveniently detected, so as to find out the faulty light emitting substrate as soon as possible. The subsequent process of the faulty light emitting substrate is no longer carried out, so as to avoid the waste of production resources, effectively monitor the corresponding backlight process and quality of the backlight product, and improve product quality.

For example, the respective test points may be exposed metal in a certain process stage, so as to facilitate placement of a probe (e.g., a test probe) for detection. During the subsequent process, the test points may be covered by a subsequent layer (e.g., an insulating layer such as a dielectric layer) and no longer exposed, or may remain exposed. For example, the respective test points are electrically connected with corresponding signal lines. The test points and the corresponding signal lines may be formed integrally, or a separately provided conductive pattern may also be electrically connected with the signal line by welding, using conductive adhesive, etc.; and the separately provided conductive pattern serves as the test point. The structural form and the formation mode of the test point are not limited in the embodiments of the present disclosure. For example, voltage detection, current detection or resistance detection may be performed on the test point with a voltmeter, an ammeter, an ohmmeter or any other applicable test instrument, and with help of a probe, so as to check whether the line between two test points has an open circuit, a short circuit, etc. For the detection principle of the open circuit, the short circuit, etc., the conventional design may be referred to, and no details will be repeated here.

Figure 8B:
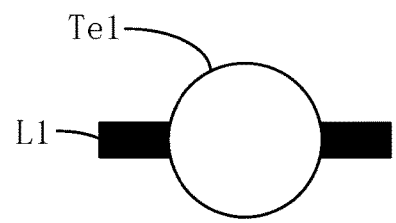
FIG. 8B and FIG. 8C are schematic plane views of a single test point in a light emitting substrate provided by some embodiments of the present disclosure.
Figure 8C:
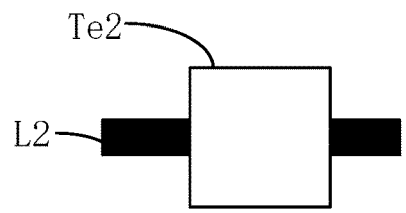

FIG. 8B and FIG. 8C are schematic plane views of a single test point in a light emitting substrate provided by some embodiments of the present disclosure. As shown in FIG. 8B, a test point Te1 overlaps and is electrically connected with a signal line L1. The test point Te1 may be any one of the first test point 181, the second test point 182, the third test point 183, and the fourth test point 184; and the signal line L1 may be any one of the address transfer line 130, the voltage transfer line 140, the source address line 150 and the source voltage line 160. For example, the shape of the test point Te1 is a circle. For example, the diameter of the circle is greater than or equal to the line width of the signal line L1, thereby facilitating placement of the probe, so that the probe may be better electrically connected with the signal line L1.

As shown in FIG. 8C, a test point Te2 overlaps and is electrically connected with a signal line L2. Similarly, the test point Te2 may be any one of the first test point 181, the second test point 182, the third test point 183, and the fourth test point 184; and the signal line L2 may be any one of the address transfer line 130, the voltage transfer line 140, the source address line 150 and the source voltage line 160. For example, the shape of the test point Te2 is a polygon, specifically, a square. For example, the side length of the square is greater than or equal to the line width of the signal line L2, thereby facilitating placement of the probe, so that the probe may be better electrically connected with the signal line L2.

It should be noted that, in the embodiments of the present disclosure, shapes of respective test points are not limited to the circle and the square as described above, or may be any regular or irregular shape such as a hexagon, an ellipse, a trapezoid, a rectangle, a triangle, etc., which may be determined according to actual needs, and will not be limited in the embodiments of the present disclosure. The relationship between the size of the test point and the size of the signal line may also be determined according to actual needs, which will not be limited in the embodiments of the present disclosure.

Hereinafter, test modes and uses of the respective test points are briefly described in conjunction with FIG. 8A. Here, by taking it as an example that the address transfer line 130 and the voltage transfer line 140 are located in a same layer, the source address line 150 and the source voltage line 160 are located in a same layer, and the two film layers are different layers, the source address line 150 and the source voltage line 160 are manufactured by a previous process, the address transfer line 130 and the voltage transfer line 140 are formed on the source address line 150 and the source voltage line 160 by a subsequent process, there is an insulating layer between the two film layers, and the corresponding traces are electrically connected through a via hole.

For example, after the source address line 150 and the source voltage line 160 are formed, the first test point 181 and the second test point 182 can be used to detect whether there is an open circuit between the source address line 150 and the source voltage line 160. For example, a test probe may be used to apply a voltage at both ends of a same source address line 150 or a same source voltage line 160, that is, to apply a voltage between the first test point 181 and the second test point 182, and meanwhile, it is tested whether there is a current between the two test points. When a current is detected, there is no open circuit between the first test point 181 and the second test point 182, that is, there is no open circuit in the corresponding source address line 150 or source voltage line 160. When there is no current detected, it indicates that there is an open circuit between the first test point 181 and the second test point 182, that is, there is an open circuit in the corresponding source address line 150 or the source voltage line 160. For example, a resistance value between the first test point 181 and the second test point 182 may also be detected. When the resistance value is infinite, it indicates that there is an open circuit between the two; and if the resistance value is within a reasonable range, it indicates that there is no open circuit between the two. For example, in some examples, a signal may be applied between the first test point Addr1_D and the second test point Addr1_U to detect whether an open circuit occurs.

For example, after the address transfer line 130 and the voltage transfer line 140 are formed, the first test point 181 and the third test point 183 may be used to test whether there is an open circuit in a line formed by the source address line 150 and the address transfer line 130, and to test whether there is an open circuit in a line formed by the source voltage line 160 and the voltage transfer line 140. For example, a test probe may be used to apply a voltage at both ends of a same line, that is, a voltage is applied between one first test point 181 and one third test point 183, and meanwhile, it is tested whether there is a current between the two test points. For example, in some examples, a signal may be applied between the first test point Addr1_D and a third test point Addr1_L to detect whether an open circuit occurs. For example, in some examples, when an open circuit occurs between the first test point Addr1_D and the third test point Addr1_L, a signal may be applied between the first test point Addr1_D and the second test point Addr1_U, and between the second test point Addr1_U and the third test point Addr1_L, so as to detect whether there is an open circuit in the respective portions. The mode of detecting an open circuit is described above, and no details will be repeated here.

For example, the third test point 183 may be used to test whether there is an open circuit in the voltage transfer line 140. For example, a test probe may be used to apply a voltage at both ends of a same voltage transfer line 140, that is, apply a voltage between one third test point 183 (e.g., the third test point 183 on the left side) and another third test point 183 (e.g., the third test point 183 on the right side), and meanwhile, it is tested whether there is a current between the two test points. For example, in some examples, a signal may be applied between a third test point Pwr1_L and a third test point Pwr1_R to detect whether an open circuit occurs. The mode of detecting an open circuit is described above, and no details will be repeated here.

For example, the second test point 182 and the fourth test point 184 may be used to find a location where an open circuit occurs after the address transfer line 130 and the voltage transfer line 140 are formed and an open circuit occurs. For example, a test probe may be used to apply a voltage between a second test point 182 and a fourth test point 184 corresponding to a same group of light emitting units 100, and meanwhile, it is tested whether there is a current between the two test points, so as to determine which line segment has an open circuit. The mode of detecting an open circuit is described above, and no details will be repeated here.

For example, in the case of short circuit, the first test point 181 may be used for detection after the source address line 150 and the source voltage line 160 are formed, and the first test point 181 may also be used for detection after the address transfer line 130 and the voltage transfer line 140 are formed. For example, a test probe may be used to apply a voltage between two first test points 181, and meanwhile, it is tested whether there is a current between the two test points. When a current is detected, there is a short circuit between the two first test points 181, that is, a short circuit between the corresponding two lines. When there is no current detected, it indicates that there is no short circuit between the two first test points 181, that is, there is no short circuit between the corresponding two lines. For example, a resistance value between the two first test points 181 may also be detected. When the resistance value is infinite, it indicates that there is no short circuit between the two; and if the resistance value is within a certain range or smaller, it indicates that there is a short circuit between the two. For example, in some examples, a signal may be applied between the first test point Addr1_D and the first test point Pwr1_D to detect whether a short circuit occurs. Similarly, the second test point 182 may also be used for short circuit detection, that is, a signal is applied between two second test points 182 to detect whether a short circuit occurs.

It should be noted that, in the respective embodiments of the present disclosure, the number and structural forms of test points are not limited, and may be determined according to actual needs. For example, it is not necessary to set test points on each signal line, but only set test points on certain signal lines which need attention, so as to simplify the manufacturing process and improve production efficiency. For example, in addition to the above-described test points, other test points may be also provided in the light emitting substrate 10 provided by the embodiments of the present disclosure, so as to meet diversified testing requirements.

For example, as shown in FIG. 8A, in some embodiments, the light emitting substrate 10 further includes a flexible printed circuit (FPC) board 170. The flexible printed circuit board 170 overlaps and is electrically connected by bonding with the source address line 150 and the source voltage line 160. The first test point 181 is located on a side of the flexible printed circuit board 170 away from the light emitting unit 100. For example, the flexible printed circuit board 170 is also used to bond with other components, such as a light emitting control circuit. The light emitting control circuit may supply a plurality of first input signals and a plurality of second input signals; and these first input signals and second input signals are transmitted to the respective source address lines 150 and source voltage lines 160 through the flexible printed circuit board 170, and further transmitted to the respective groups of light emitting units 100, so as to control the light emitting substrate 10 to emit light.

Figure 9:
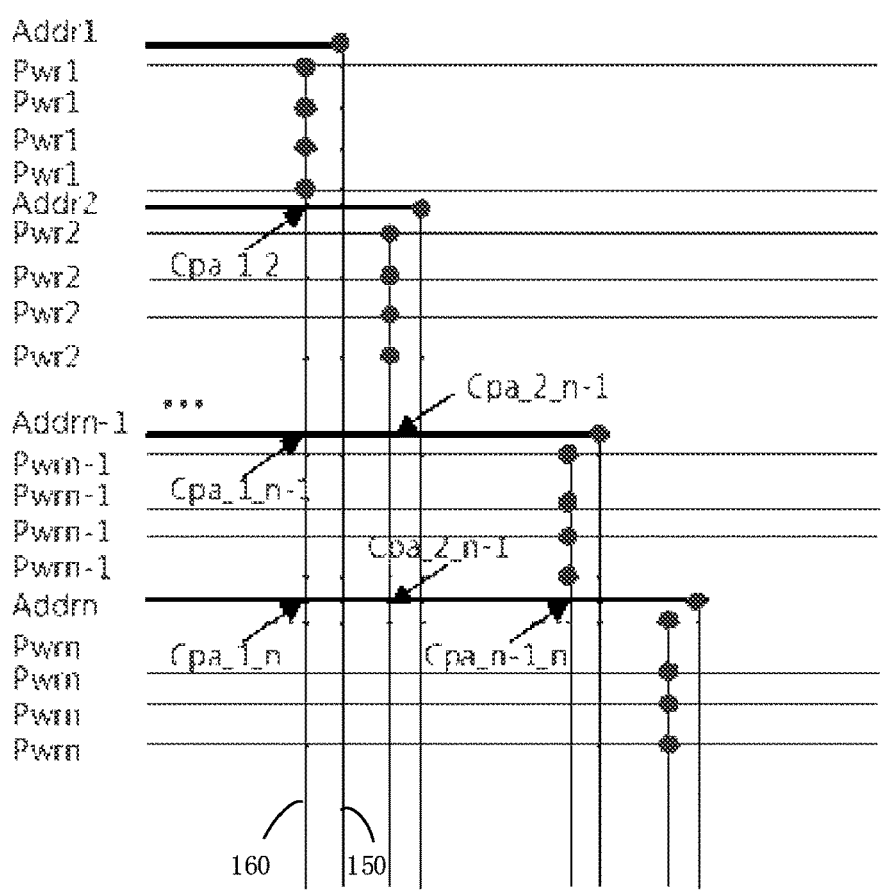
FIG. 9 is a schematic diagram of wiring of a light emitting substrate provided by some embodiments of the present disclosure.

FIG. 9 is a schematic diagram of wiring of a light emitting substrate provided by some embodiments of the present disclosure. For example, as shown in FIG. 9, in the light emitting substrate, the plurality of source address lines 150 and the plurality of source voltage lines 160 are alternately arranged.

For example, a source address line xAddr1 and a source voltage line xPwr1 on a leftmost side are used to supply a first input signal and a second input signal to the first group of light emitting units 100. Because the first group of light emitting units 100 is located on the uppermost side of the light emitting substrate, the source address line xAddr1 and the source voltage line xPwr1 are relatively long; the source address line xAddr1 is electrically connected with the address transfer line Addr1 to transmit the first input signal to the first input terminal Di of the driving circuit 110 of the first light emitting unit 100 in the group; and the source voltage line xPwr1 is electrically connected with a plurality of address transfer lines Pwr1 corresponding to the group of light emitting units 100 to transmit the second input signal to second input terminals Pwr of driving circuits 110 of all the light emitting units 100 in the group.

For example, the source address line xAddrn and the source voltage line xPwrn on the rightmost side are used to supply a first input signal and a second input signal to the last group of light emitting units 100. Because the last group of light emitting units 100 is located on the lowermost side of the light emitting substrate, the source address line xAddrn and the source voltage line xPwrn are relatively short; the source address line xAddrn is electrically connected with the address transfer line Addrn to transmit the first input signal to the first input terminal Di of the driving circuit 110 of the first light emitting unit 100 in the group; and the source voltage line xPwrn is electrically connected with a plurality of address transfer lines Pwrn corresponding to the group of light emitting units 100 to transmit the second input signal to second input terminals Pwr of driving circuits 110 of all the light emitting units 100 in the group.

For example, from left to right, lengths of the plurality of source voltage lines xPwr1, xPwr2, . . . , xPwrn are sequentially reduced; and lengths of the plurality of source address lines xAddr1, xAddr2, . . . , xAddrn are also sequentially reduced. Therefore, the leftmost source voltage line xPwr1 overlaps with all the other address transfer lines Addr2, . . . , Addrn−1, Addrn except for the address transfer line Addr1, and sequentially generates capacitance $Cpa\_1\_2, \ldots, Cpa\_1\_n-1, Cpa\_1\_n$. Similarly, the source voltage line xPwr2 overlaps with all the other address transfer lines Addr3, . . . , Addrn−1, Addrn except for the address transfer lines Addr1 and Addr2, and sequentially generates capacitance $Cpa\_2\_3, \ldots, Cpa\_2\_n-1, Cpa\_2\_n$. Similarly, the source voltage line xPwrn−1 overlaps with the address transfer line Addrn and generates capacitance Cpa_n−1 n. For example, the above-described capacitance may be parasitic capacitance generated between lines, rather than a separate capacitive device.

In the process of design and use, load of the second input signals in the plurality of source voltage lines xPwr1, xPwr2, . . . , xPwrn need to be lower than a certain value; and capacitance corresponding to the second input signal needs to be as small as possible. In the light emitting substrate shown in FIG. 9, capacitance generated due to the source voltage lines xPwr1, xPwr2, . . . , xPwrn−1 overlapping with the address transfer lines Addr2, . . . , Addrn−1, Addrn may cause additional load, which, thus, may has an additional impact on optical performance of the backlight using the light emitting substrate.

Moreover, when the light emitting substrate is applied to a backlight and the backlight is applied to a display device, the backlight including the light emitting substrate is usually stacked with a separately provided display panel, and the display panel is arranged on the backlight. The display panel usually includes a gate driving circuit. The gate driving circuit, for example, is formed on a left side of the display panel to form a gate driver on array (GOA) circuit for supplying row scanning signals to pixels in the display panel. As shown in FIG. 9, the leftmost source address line xAddr1 and source voltage line xPwr1 have relatively long lengths in the second direction, so they may affect the GOA circuit in the display panel, and cause signal crosstalk between the backlight and the display panel, which may have an additional impact on the display effect of the display device.

Figure 10:
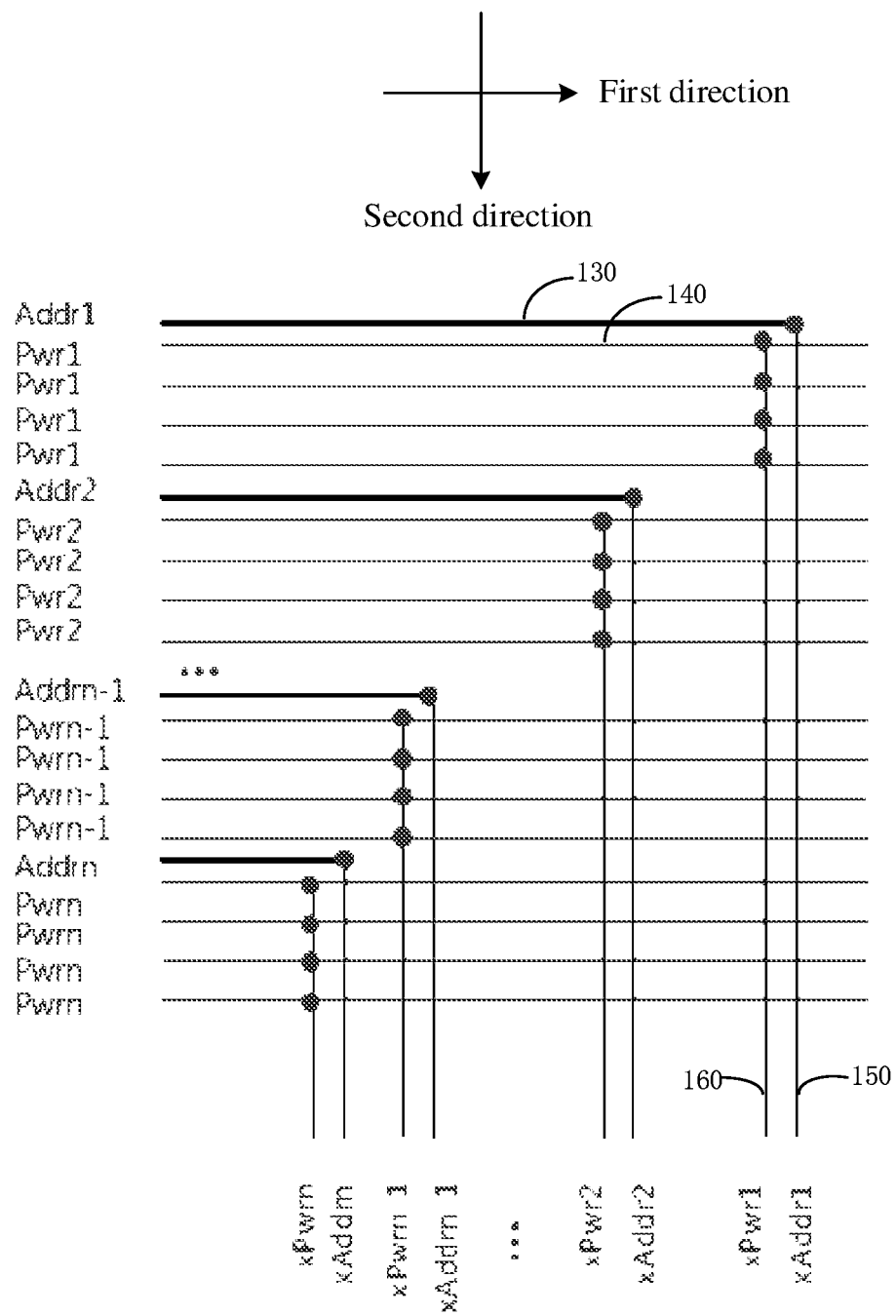
FIG. 10 is a schematic diagram of wiring of another light emitting substrate provided by some embodiments of the present disclosure.

FIG. 10 is a schematic diagram of wiring of another light emitting substrate provided by some embodiments of the present disclosure, and the light emitting substrate can effectively avoid the above-described problems.

For example, as shown in FIG. 10, in some embodiments, a plurality of source address lines 150 are arranged along the first direction. Lengths of the plurality of source address lines 150 along the second direction are different from each other; and between two source address lines 150 farthest apart along the first direction, a length of a source address line 150 closer to a gate driving circuit in a display panel stacked on the light emitting substrate 10 is shorter than a length of a source address line 150 farther away from the gate driving circuit. A plurality of source voltage lines 160 are arranged along the first direction. Lengths of the plurality of source voltage lines 160 along the second direction are different from each other; and between two source voltage lines 160 farthest apart along the first direction, a length of a source voltage line 160 closer to the gate driving circuit is less than a length of a source voltage line 160 farther away from the gate driving circuit.

For example, in this example, N=36, X=4, N/X=36/4=9, that is, every 4 rows of light emitting units 100 share one second input signal, every 4 rows of light emitting units 100 need to be supplied with one first input signal, and the light emitting units 100 are divided into 9 groups from top to bottom. For example, a source voltage line xPwr1 supplies a second input signal to light emitting units 100 in rows 1 to 4; a source voltage line xPwr2 supplies a second input signal to light emitting units 100 in rows 5 to 8, and so on. Accordingly, a source address line xAddr1 is connected with a first input terminal Di of a driving circuit 110 of a light emitting unit 100 in a first row and a first column; and a source address line xAddr2 is connected with a first input terminal Di of a driving circuit 110 of a light emitting unit 100 in a fifth row and a first column, and so on.

For example, a source address line xAddrn and a source voltage line xPwrn on the leftmost side are used to supply a first input signal and a second input signal to the last group of light emitting units 100. Because the last group of light emitting units 100 are located on the lowermost side of the light emitting substrate, the source address line xAddrn and the source voltage line xPwrn are relatively short. A source address line xAddr1 and a source voltage line xPwr1 on the rightmost side are used to supply a first input signal and a second input signal to the first group of light emitting units 100. Because the first group of light emitting units 100 is located on the uppermost side of the light emitting substrate, the source address line xAddr1 and the source voltage line xPwr1 are relatively long.

For example, the plurality of source address lines 150 are parallel to each other, and lengths of the plurality of source address lines 150 arranged sequentially along the first direction change monotonously, for example, sequentially become longer from left to right. The plurality of source voltage lines 160 are parallel to each other, and lengths of the plurality of source voltage lines 160 arranged sequentially in the first direction change monotonously, for example, sequentially become longer from left to right. For example, as shown in FIG. 1 and FIG. 10, the source address line 150 and the source voltage line 160 corresponding to a same group of light emitting units 100 are arranged adjacent to each other; and the source address lines 150 and the source voltage lines 160 are located in gaps of a plurality of columns of light emitting units 100. The source address lines 150 and the source voltage lines 160 are arranged in the gaps of the plurality of columns of light emitting units 100, instead of being arranged on the leftmost or rightmost side of the plurality of columns of light emitting units 100, which may prevent the signal in the source address lines 150 and the source voltage lines 160 from affecting the display panel stacked on the light emitting substrate 10.

For example, the source voltage line 160 does not overlap with any address transfer line 130. Therefore, no capacitance (e.g., parasitic capacitance) is generated between the source voltage line 160 and the address transfer line 130, and thus no additional load is caused, so that optical performance of the backlight using the light emitting substrate 10 is improved.

In addition, because the gate driving circuit is usually arranged on the leftmost side of the display panel, the source address line xAddrn and the source voltage line xPwrn on the leftmost side in the light emitting substrate 10 have relatively short lengths in the second direction, which, thus, has less impact on the gate driving circuit, and may reduce or avoid crosstalk between the backlight and the display panel, thereby improving the display effect of the display device.

It should be noted that, in the embodiments of the present disclosure, locations for arranging the address transfer line 130, the voltage transfer line 140, the source address line 150, and the source voltage line 160 may be changed according to needs, and are not limited to the manner shown in FIG. 9 and FIG. 10, so as to better adapt to application scenarios and better meet application requirements.

Figure 11:
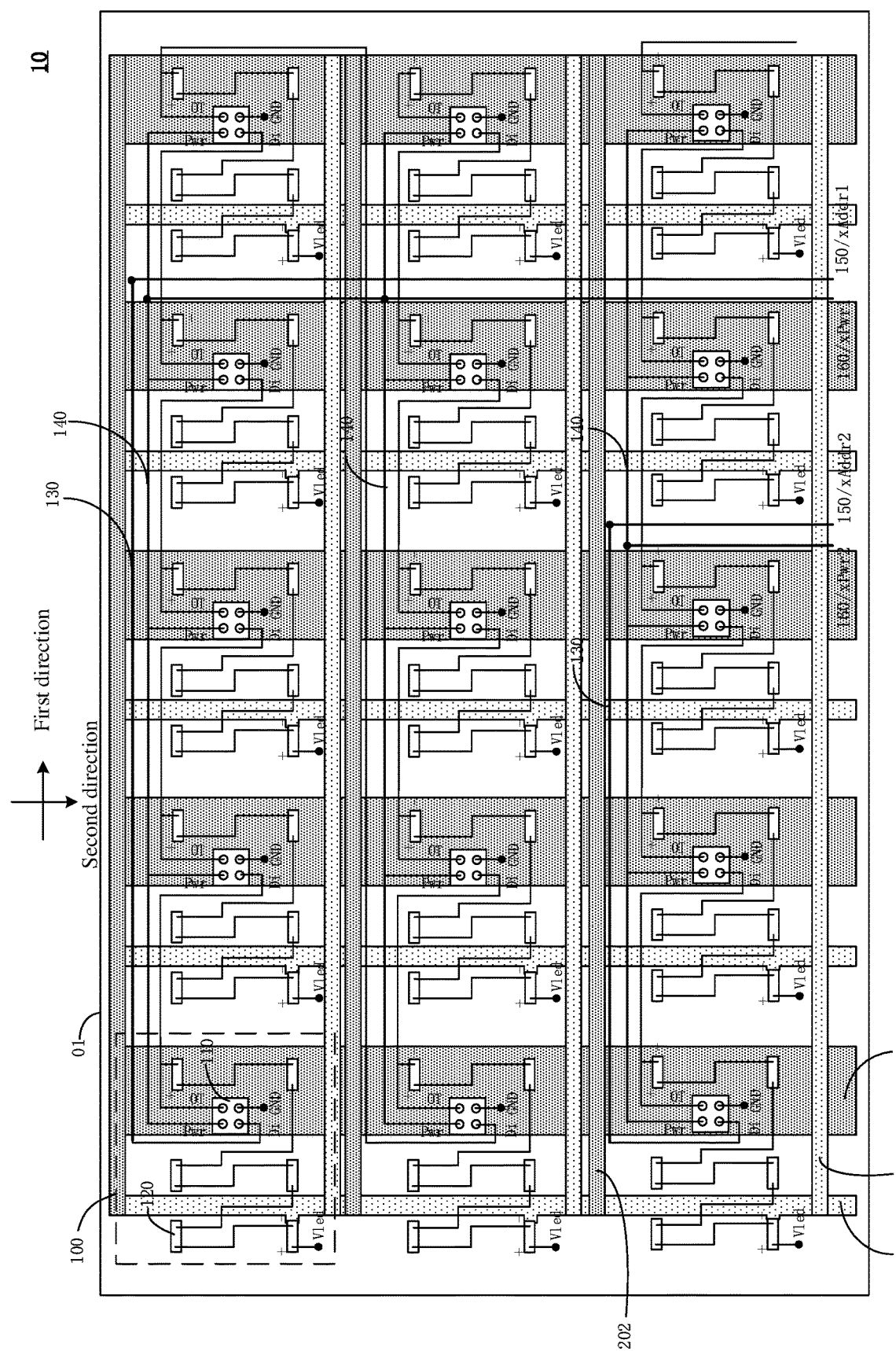
FIG. 11 is a schematic diagram of another light emitting substrate provided by some embodiments of the present disclosure.

FIG. 11 is a schematic diagram of another light emitting substrate provided by some embodiments of the present disclosure. For example, as shown in FIG. 11, in some embodiments, the light emitting substrate 10 further includes a plurality of first driving voltage lines 191 and a plurality of first common voltage lines 201 extending along the second direction, and further includes a plurality of second driving voltage lines 192 and a plurality of second common voltage lines 202 extending along the first direction.

For example, the first driving voltage line 191 is electrically connected with the driving voltage terminal Vled of each light emitting unit 100, and is configured to transmit the driving voltage. The second driving voltage line 192 is electrically connected with the first driving voltage line 191 and forms a grid-like trace so as to reduce transmission resistance and improve voltage consistency in the light emitting substrate 10.

For example, the first common voltage line 201 is electrically connected with the common voltage terminal GND of the driving circuit 110 of each light emitting unit 100, and is configured to transmit the common voltage (e.g., a ground voltage). The second common voltage line 202 is electrically connected with the first common voltage line 201 and forms a grid-like trace so as to reduce transmission resistance and improve voltage consistency in the light emitting substrate 10.

For example, the first driving voltage line 191 and the first common voltage line 201 are located in a same layer, and are located in a same layer as the source address line 150 and the source voltage line 160. Because the first driving voltage line 191, the first common voltage line 201, the source address line 150, and the source voltage line 160 all extend along the second direction, the four may be arranged in a same layer without overlapping with each other, so as to simplify the structure and simplify the manufacturing process.

For example, the second driving voltage line 192 and the second common voltage line 202 are located in a same layer, and are located in a same layer as the address transfer line 130 and the voltage transfer line 140. Because the second driving voltage line 192, the second common voltage line 202, the address transfer line 130, and the voltage transfer line 140 all extend along the first direction, the four may be arranged in a same layer without overlapping with each other, so as to simplify the structure and simplify the manufacturing process.

It should be noted that, the film layer where the first driving voltage line 191 in FIG. 11 is located is below the light emitting element 120, so, the first driving voltage line 191 may extend below a positive electrode of the light emitting element 120 and be electrically connected with the positive electrode of the light emitting element 120 through a via hole, that is, the first driving voltage line 191 transmits the driving voltage to an anode of the light emitting element 120 (i.e., to the driving voltage terminal Vled). In FIG. 11, although a negative electrode of the light emitting element 120 overlaps with the first driving voltage line 191, yet the negative electrode of the light emitting element 120 is not electrically connected with the first driving voltage line 191 because the two are located in different layers. For example, the film layer where the first common voltage line 201 is located is below the driving circuit 110, so, the first common voltage line 201 is located below the driving circuit 110 and is electrically connected with the common voltage terminal GND of the driving circuit 110 through a via hole.

It should be noted that, in the embodiments of the present disclosure, lengths and widths of the first driving voltage line 191, the second driving voltage line 192, the first common voltage line 201, and the second common voltage line 202 may be set to arbitrary values; the lengths may be the same or different, and the widths may also be the same or different, which may be determined according to actual needs, and will not be limited in the embodiments of the present disclosure.

At least one embodiment of the present disclosure further provides a display device, and the display device includes a display panel and the light emitting substrate provided by any one of the embodiments of the present disclosure. The display device may implement partitioned independent control of light emission brightness with low power consumption, high integration, simple control mode, and may cooperate with a liquid crystal display device to implement high-contrast display.

Figure 12:
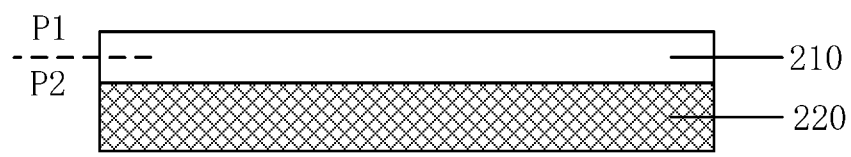
FIG. 12 is a cross-sectional schematic diagram of a display device provided by some embodiments of the present disclosure.

FIG. 12 is a cross-sectional schematic diagram of a display device provided by some embodiments of the present disclosure. For example, as shown in FIG. 12, in some embodiments, a display device 20 includes a display panel 210 and a light emitting substrate 220. For example, the light emitting substrate 220 may be the light emitting substrate provided by any one of the embodiments of the present disclosure, for example, the foregoing light emitting substrate 10.

For example, the display panel 210 has a display side P1 and a non-display side P2 opposite to the display side P1; and the light emitting substrate 220 is provided on the non-display side P2 of the display panel 210 as a backlight unit. For example, the light emitting substrate 220 may serve as a surface light source to supply backlight to the display panel 210. For example, the display panel 210 may be a liquid crystal display (LCD) panel, an electronic paper display panel, etc., which is not limited in the embodiments of the present disclosure.

For example, the display device 20 may be an LCD device, an electronic paper display device, etc., or may also be other devices having a display function, etc., which is not limited in the embodiments of the present disclosure. For example, the display device 20 may be a mobile phone, a tablet personal computer, a television, a display, a laptop, a digital photo frame, a navigator, an E-book, and any other product or component having a display function, which is not limited in the embodiments of the present disclosure.

It should be noted that, the light emitting substrate 10 provided by the embodiments of the present disclosure may be applied to the above-described display device 20 as a backlight unit, or may be used alone as a substrate having a display function or a light emitting function, which is not limited in the embodiments of the present disclosure.

For detailed description and technical effects of the display device 20, the above description of the light emitting substrate 10 may be referred to, and no details will be repeated here. The display device 20 may further include more components and structures, which may be determined according to actual needs, and will not be limited in the embodiments of the present disclosure.

At least one embodiment of the present disclosure further provides a method of driving a light emitting substrate, and the light emitting substrate provided by any one of the embodiments of the present disclosure may be driven by using the method. The method may be used for implementing partitioned independent control of light emission brightness with simple control mode, and may cooperate with a liquid crystal display device to implement high-contrast display.

For example, in some embodiments, the method includes operations below.

A first input signal and a second input signal are supplied, so that an output terminal OT outputs a relay signal in a first period, and the output terminal OT supplies a driving signal to a plurality of light emitting elements 120 sequentially connected in series in a second period, so as to allow the plurality of light emitting elements 120 to emit light under action of the driving signal in the second period.

For detailed description and technical effects of the method, the above description of the light emitting substrate 10 may be referred to, and no details will be repeated here. The method may further include more steps and operations, which may be determined according to actual needs, and will not be limited in the embodiments of the present disclosure.

The following statements should be noted.

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiment(s) can be combined with each other to obtain new embodiment(s).

What have been described above are only specific implementations of the present disclosure, and are not intended to limit the protection scope of the present disclosure, and the protection scope of the present disclosure should be based on the protection scope of the appended claims.

What is claimed is:

1. A display device, comprising a display panel and a light emitting substrate, wherein the display panel has a display side and a non-display side opposite to the display side, and the light emitting substrate is provided on the non-display side of the display panel as a backlight unit, the light emitting substrate comprises a plurality of light emitting units arranged in an array, wherein each light emitting unit comprises a driving circuit, a plurality of light emitting elements, and a driving voltage terminal, the driving circuit comprises a first input terminal, a second input terminal, and an output terminal, and the plurality of light emitting elements are sequentially connected in series and connected between the driving voltage terminal and the output terminal, the driving circuit is configured to output a relay signal through the output terminal in a first period according to a first input signal received by the first input terminal and a second input signal received by the second input terminal, and supply a driving signal to the plurality of light emitting elements sequentially connected in series through the output terminal in a second period, wherein the light emitting substrate further comprises a plurality of address transfer lines, wherein the plurality of address transfer lines extend in a first direction and are configured to transmit the first input signal, the plurality of light emitting units are arranged in N rows and M columns and are divided into a plurality of groups, each group of light emitting units comprises X rows and M columns, a total of X*M light emitting units, and the plurality of address transfer lines are in one-to-one correspondence with the plurality of groups of light emitting units, in a same group of light emitting units, the X*M light emitting units are sequentially numbered according to row and column distribution positions, a first input terminal of a driving circuit of a light emitting unit numbered 1 is electrically connected with an address transfer line corresponding to the group of light emitting units, an output terminal of a driving circuit of a light emitting unit numbered P is electrically connected with a first input terminal of a driving circuit of a light emitting unit numbered P+1, and the first input terminal of the driving circuit of the light emitting unit numbered P+1 receives a relay signal output by the output terminal of the driving circuit of the light emitting unit numbered P as the first input signal, N is an integer greater than 0, M is an integer greater than 0, $0<X\leq N$ and X is an integer, and $0<P<X*M$ and P is an integer.

2. The display device according to claim 1, wherein the driving circuit further comprises a demodulating circuit, a physical layer interface circuit, a data processing control circuit, a pulse width modulating circuit, a driving signal generating circuit, and a relay signal generating circuit;

the demodulating circuit is electrically connected with the second input terminal and the physical layer interface circuit, and is configured to demodulate the second input signal to obtain communication data, and transmit the communication data to the physical layer interface circuit;

the physical layer interface circuit is also electrically connected with the data processing control circuit, and is configured to process the communication data to obtain a data frame, and transmit the data frame to the data processing control circuit;

the data processing control circuit is also electrically connected with the first input terminal, the pulse width modulating circuit, and the relay signal generating circuit, and is configured to generate a pulse width control signal based on the data frame and transmit the pulse width control signal to the pulse width modulating circuit, and generate a relay control signal based on the first input signal and transmit the relay control signal to the relay signal generating circuit;

the pulse width modulating circuit is also electrically connected with the driving signal generating circuit, and is configured to generate a pulse width modulating signal in response to the pulse width control signal, and transmit the pulse width modulating signal to the driving signal generating circuit;

the driving signal generating circuit is also electrically connected with the output terminal, and is configured to generate the driving signal in response to the pulse width modulating signal, and output the driving signal through the output terminal; and the relay signal generating circuit is also electrically connected with the output terminal, and is configured to generate the relay signal based on the relay control signal, and output the relay signal through the output terminal.

3. The display device according to claim 2, wherein the second input signal is a power line carrier communication signal, and the power line carrier communication signal contains information corresponding to the communication data.

4. The display device according to claim 1, wherein, in a same group of light emitting units, the X*M light emitting units are sequentially numbered row by row and column by column in a Z-shape, or sequentially numbered row by row and column by column in an S-shape.

5. The display device according to claim 1, wherein the light emitting substrate further comprises a plurality of voltage transfer lines, wherein the plurality of voltage transfer lines extend along the first direction and are configured to transmit the second input signal, and the plurality of voltage transfer lines are in one-to-one correspondence with N rows of light emitting units, and the second input terminal of the driving circuit is electrically connected with a voltage transfer line corresponding to the row of light emitting units comprising the driving circuit.

6. The display device according to claim 5, wherein the light emitting substrate further comprises a plurality of source address lines and a plurality of source voltage lines extending in a second direction, wherein the plurality of source address lines are electrically connected with the plurality of address transfer lines in one-to-one correspondence, and are configured to transmit the first input signal, the plurality of source voltage lines are in one-to-one correspondence with the plurality of groups of light emitting units, and each source voltage line is electrically connected with a plurality of voltage transfer lines corresponding to a corresponding group of light emitting units, and is configured to transmit the second input signal, and the first direction intersects with the second direction.

7. The display device according to claim 6, wherein the source address lines and the source voltage lines are in a same layer, the voltage transfer lines and the address transfer lines are in a same layer, and the source address lines and the address transfer lines are in different layers.

8. The display device according to claim 6, wherein the light emitting substrate further comprises a plurality of first test points, a plurality of second test points, a plurality of third test points, and a plurality of fourth test points, wherein the plurality of first test points each are at one end of a source address line or a source voltage line that is away from the light emitting unit;

the plurality of second test points each are at a connection position between the source address line and the address transfer line, and at a connection position between the source voltage line and a voltage transfer line having a distance farthest from a first test point among the voltage transfer lines connected with the source voltage line;

the plurality of third test points are at both ends of the voltage transfer lines, and at an end of the address transfer line away from the light emitting unit; and the plurality of fourth test points each are at a connection position among connection positions between the source voltage lines and the voltage transfer lines except for positions where the second test points are located.

9. The display device according to claim 6, wherein the plurality of source address lines are arranged along the first direction, lengths of the plurality of source address lines along the second direction are different from each other, and in two source address lines farthest apart along the first direction, a length of a source address line closer to a gate driving circuit in a display panel stacked on the light emitting substrate is less than a length of a source address line farther away from the gate driving circuit; and the plurality of source voltage lines are arranged along the first direction, lengths of the plurality of source voltage lines along the second direction are different from each other, and in two source voltage lines farthest apart along the first direction, a length of a source voltage line closer to the gate driving circuit is less than a length of a source voltage line farther away from the gate driving circuit.

10. The display device according to claim 9, wherein the plurality of source address lines are parallel to each other, and the lengths of the plurality of source address lines arranged sequentially along the first direction change monotonously; and the plurality of source voltage lines are parallel to each other, and the lengths of the plurality of source voltage lines arranged sequentially along the first direction change monotonously.

11. The display device according to claim 9, wherein a source address line and a source voltage line corresponding to a same group of light emitting units are arranged adjacent to each other.

12. The display device according to claim 9, wherein the source voltage line does not overlap with the address transfer line.

13. The display device according to claim 6, wherein the source address lines and the source voltage lines are in gaps of a plurality of columns of light emitting units.

14. The display device according to claim 6, wherein the light emitting substrate further comprises a plurality of first driving voltage lines and a plurality of first common voltage lines extending along the second direction, wherein the first driving voltage lines are electrically connected with a driving voltage terminal of each light emitting unit, and are configured to transmit a driving voltage, the driving circuit further comprises a common voltage terminal, and the first common voltage lines are electrically connected with the common voltage terminal of the driving circuit of each light emitting unit and are configured to transmit a common voltage.

15. The display device according to claim 14, wherein the first driving voltage lines and the first common voltage lines are in a same layer, and are in a same layer as the source address lines and the source voltage lines.

16. The display device according to claim 14, wherein the light emitting substrate further comprises a plurality of second driving voltage lines and a plurality of second common voltage lines extending along the first direction, wherein the second driving voltage lines are electrically connected with the first driving voltage lines and form a grid-like trace, the second common voltage lines are electrically connected with the first common voltage lines and form a grid-like trace, and the second driving voltage lines and the second common voltage lines are in a same layer, and are in a same layer as the address transfer lines and the voltage transfer lines.

17. The display device according to claim 1, wherein, in a same light emitting unit, the plurality of light emitting elements are arranged in an array, and the driving circuit is in gaps of the plurality of light emitting elements.

18. A method of driving a light emitting substrate, the light emitting substrate comprising a plurality of light emitting units arranged in an array, wherein each light emitting unit comprises a driving circuit, a plurality of light emitting elements, and a driving voltage terminal, the driving circuit comprises a first input terminal, a second input terminal, and an output terminal, and the plurality of light emitting elements are sequentially connected in series and connected between the driving voltage terminal and the output terminal, the driving circuit is configured to output a relay signal through the output terminal in a first period according to a first input signal received by the first input terminal and a second input signal received by the second input terminal, and supply a driving signal to the plurality of light emitting elements sequentially connected in series through the output terminal in a second period, the method comprising:

supplying the first input signal and the second input signal, so that the output terminal outputs the relay signal in the first period, and the output terminal supplies, in the second period, the driving signal to the plurality of light emitting elements sequentially connected in series, so as to allow the plurality of light emitting elements to emit light under action of the driving signal in the second period, wherein the light emitting substrate further comprises a plurality of address transfer lines, wherein the plurality of address transfer lines extend in a first direction and are configured to transmit the first input signal, the plurality of light emitting units are arranged in N rows and M columns and are divided into a plurality of groups, each group of light emitting units comprises X rows and M columns, a total of X*M light emitting units, and the plurality of address transfer lines are in one-to-one correspondence with the plurality of groups of light emitting units, in a same group of light emitting units, the X*M light emitting units are sequentially numbered according to row and column distribution positions, a first input terminal of a driving circuit of a light emitting unit numbered 1 is electrically connected with an address transfer line corresponding to the group of light emitting units, an output terminal of a driving circuit of a light emitting unit numbered P is electrically connected with a first input terminal of a driving circuit of a light emitting unit numbered P+1, and the first input terminal of the driving circuit of the light emitting unit numbered P+1 receives a relay signal output by the output terminal of the driving circuit of the light emitting unit numbered P as the first input signal, N is an integer greater than 0, M is an integer greater than 0, $0<X\leq N$ and X is an integer, and $0<P<X*M$ and P is an integer.

* * * * *